(12) United States Patent
Fujioka et al.

(10) Patent No.: US 8,193,699 B2
(45) Date of Patent: Jun. 5, 2012

(54) DISPLAY UNIT HAVING INSULATING FILM WITH TAPERED PORTIONS

(75) Inventors: Hirofumi Fujioka, Kanagawa (JP); Yasunobu Hiromasu, Kanagawa (JP)

(73) Assignee: Sony Corporation, Tokyo (JP)

( * ) Notice: Subject to any disclaimer, the term of this patent is extended or adjusted under 35 U.S.C. 154(b) by 139 days.

(21) Appl. No.: 12/466,719

(22) Filed: May 15, 2009

(65) Prior Publication Data

US 2009/0284144 A1 Nov. 19, 2009

(30) Foreign Application Priority Data

May 16, 2008 (JP) .................................. 2008-129858

(51) Int. Cl.
*H01J 1/62* (2006.01)
*H01J 63/04* (2006.01)

(52) U.S. Cl. ........ 313/504; 313/483; 313/500; 313/501; 313/502; 313/503; 313/505; 313/506

(58) Field of Classification Search ........................ None
See application file for complete search history.

(56) References Cited

U.S. PATENT DOCUMENTS

| | | | |
|---|---|---|---|
| 6,222,315 B1 | 4/2001 | Yoshizawa et al. | |
| 6,498,428 B1 | 12/2002 | Matsuura et al. | |
| 7,034,453 B2 * | 4/2006 | Kai et al. | 313/504 |
| 7,336,030 B2 * | 2/2008 | Funamoto et al. | 313/506 |
| 8,004,477 B2 * | 8/2011 | Uchino et al. | 345/76 |
| 2007/0115225 A1 | 5/2007 | Uchino et al. | |

FOREIGN PATENT DOCUMENTS

| | | |
|---|---|---|
| JP | 11-097182 | 4/1999 |
| JP | 3247388 | 11/2001 |
| JP | 2005-326799 A | 11/2005 |
| JP | 2007-123286 A | 5/2007 |
| JP | 2007-148129 | 6/2007 |

OTHER PUBLICATIONS

Japanese Patent Office, Office Action issued in Patent Application JP 2008-129858, on Apr. 27, 2010.

\* cited by examiner

*Primary Examiner* — Natalie Walford
(74) *Attorney, Agent, or Firm* — SNR Denton US LLP

(57) ABSTRACT

A display unit capable of preventing breaking of a second electrode and decreasing a leakage current through an organic layer is provided. The display unit includes a plurality of organic light emitting devices over a flat substrate. Each of the plurality of organic light emitting devices has a first electrode, an insulating film having an aperture correspondingly to the first electrode, an organic layer formed at least on the first electrode in the aperture and composed of a plurality of layers including a light emitting layer, and a second electrode sequentially. The insulating film has a low taper section having a tilt angle formed by a side face of the aperture and a flat face of the substrate that is smaller than a tilt angle of the other section of a circumference of the aperture in part of the circumference of the aperture.

4 Claims, 22 Drawing Sheets

US 8,193,699 B2

DISPLAY UNIT HAVING INSULATING FILM WITH TAPERED PORTIONS

BACKGROUND OF THE INVENTION

1. Field of the Invention

The present invention relates to a display unit including an organic light emitting device.

2. Description of the Related Art

An organic light emitting device has a first electrode, an organic layer including a light emitting layer, and a second electrode sequentially over a substrate. In the case where a direct voltage is applied between the first electrode and the second electrode, electron-hole recombination is generated in the light emitting layer and light is generated. Between each device, an insulating film to separate each device is provided. The insulating film is provided with an aperture correspondingly to the first electrode. A side face of the aperture generally has a tilt angle (taper angle) to the flat face of the substrate.

In the past, for the shape of the insulating film, 1. to decrease the tilt angle (for example, as described in Japanese Unexamined Patent Application Publication No. 11-97182) and 2. to approximate the tilt angle to a right angle (for example, described in Japanese Patent No. 3247388) have been proposed.

SUMMARY OF THE INVENTION

However, in the case where the tilt angle is entirely small as in the foregoing case of "1. to decrease the tilt angle," if a drive circuit using the organic light emitting device as a capacity is used (for example, described in Japanese Unexamined Patent Application Publication No. 2007-148129), a slight leakage current is flown from the first electrode to the second electrode through the organic layer in correction operation of a threshold voltage of a drive transistor, and thereby a source electric potential of the drive transistor is shifted. As a result, there is a disadvantage that luminance non-uniformity is generated.

Meanwhile, in the case where the tilt angle is entirely large as in the foregoing case of "2. to approximate the tilt angle to a right angle," there is a possibility that breaking of the second electrode is generated and no light is emitted.

In view of the foregoing, in the invention, it is desirable to provide a display unit capable of preventing breaking of the second electrode and decreasing a leakage current through the organic layer.

According to an embodiment of the invention, there is provided a display unit including a plurality of organic light emitting devices over a flat substrate. Each of the plurality of organic light emitting devices has a first electrode, an insulating film having an aperture correspondingly to the first electrode, an organic layer formed at least on the first electrode in the aperture and composed of a plurality of layers including a light emitting layer, and a second electrode sequentially. The insulating film has a low taper section having a tilt angle formed by a side face of the aperture and a flat face of the substrate that is smaller than a tilt angle of the other section of a circumference of the aperture in part of the circumference of the aperture.

The "tilt angle" means the maximum angle out of tilt angles in each point located in a region from the end of the side face of the aperture to the portion having the largest thickness.

In the display unit according to the embodiment of the invention, the insulating film has the low taper section having the tilt angle formed by the side face of the aperture and the flat face of the substrate that is smaller than the tilt angle of the other section of the circumference of the aperture in part of the circumference of the aperture. Therefore, in the section other than the low taper section, the tilt angle is large and a leakage current through the organic layer is decreased. Meanwhile, in the low taper section, breaking of the second electrode is prevented.

In the display unit according to the embodiment of the invention, the insulating film has the low taper section having the tilt angle formed by the side face of the aperture and the flat face of the substrate that is smaller than the tilt angle of the other section of the circumference of the aperture in part of the circumference of the aperture. Therefore, breaking of the second electrode may be prevented, and the leakage current through the organic layer may be decreased. In particular, this embodiment is suitable for a case using a drive circuit using the organic light emitting device as a capacity, and the generation of luminance non-uniformity may be inhibited.

Other and further objects, features and advantages of the invention will appear more fully from the following description.

DETAILED DESCRIPTION OF THE PREFERRED EMBODIMENTS

Embodiments of the invention will be hereinafter described in detail with reference to the drawings.

First Embodiment

Figure 1:
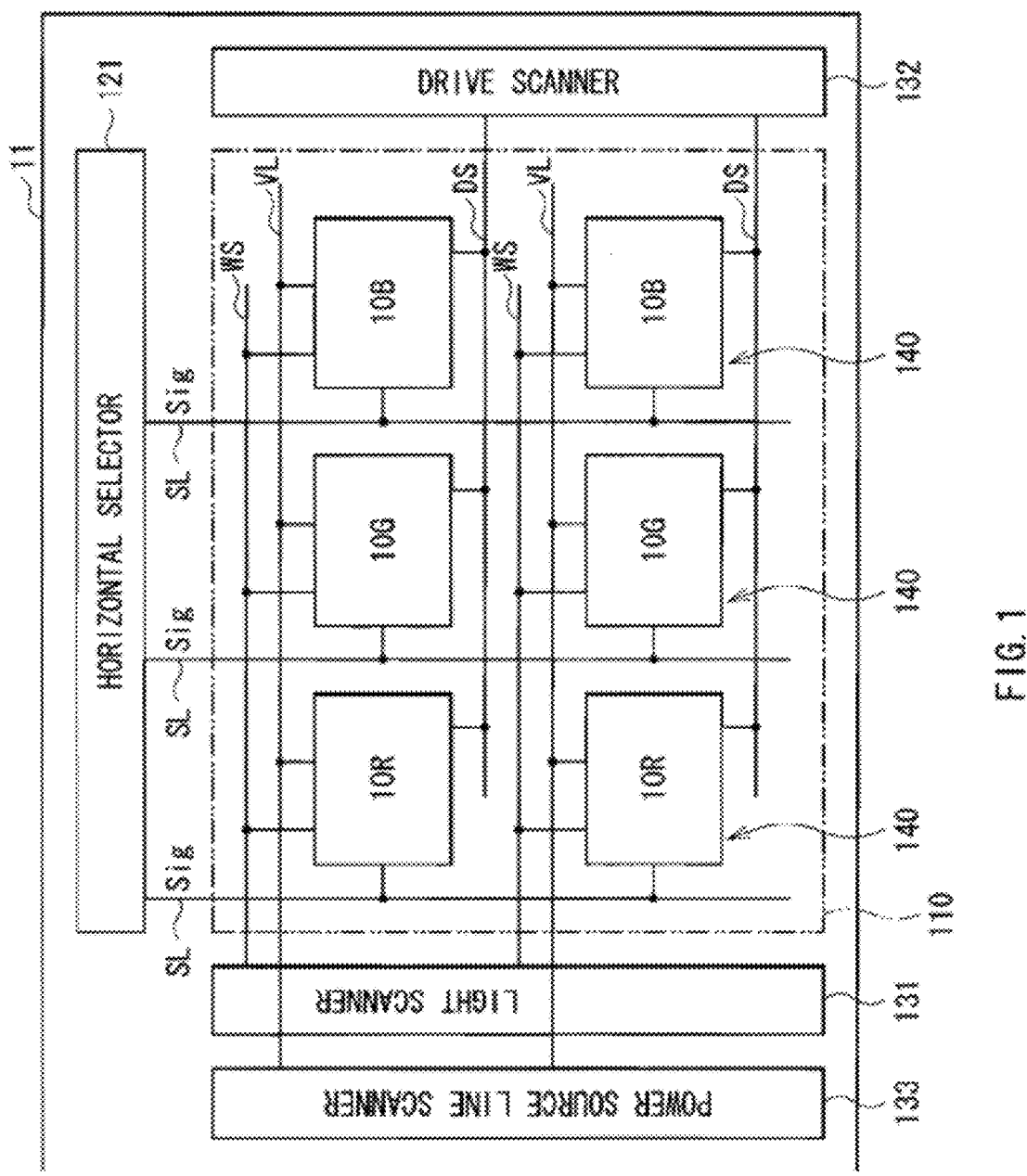
FIG. 1 is a diagram illustrating a configuration of a display unit according to a first embodiment of the invention.

FIG. 1 illustrates a configuration of a display unit according to a first embodiment of the invention. The display unit is used as an ultrathin organic light emitting color display unit or the like. In the display unit, for example, a display region 110 in which a plurality of organic light emitting devices 10R, 10G, and 10B described later (hereinafter generically referred to as "organic light emitting device EL") are arranged in a matrix state is formed on a substrate 11 made of glass, a silicon (Si) wafer, a resin or the like. On the periphery of the display region 110, a horizontal selector 121 as a signal section, and a light scanner 131, a drive scanner 132, and a power source line scanner 133 as a scanner section are formed.

In the display region 110, a plurality of signal lines SL are arranged in the column direction, and a plurality of scanning lines WS and DS and a plurality of power source lines VL are arranged in the row direction. A pixel circuit 140 including the organic light emitting device EL (one of 10R, 10G, and 10B (sub pixel)) is provided at each cross section between each signal line SL and each scanning line WS and DS. Each signal line SL is connected to the horizontal selector 121. A video signal Sig is supplied from the horizontal selector 121 to the signal line SL. Each scanning line WS is connected to the light scanner 131. Each scanning line DS is connected to the drive scanner 132. Each power source line VL is connected to the power source line scanner 133.

Figure 2:
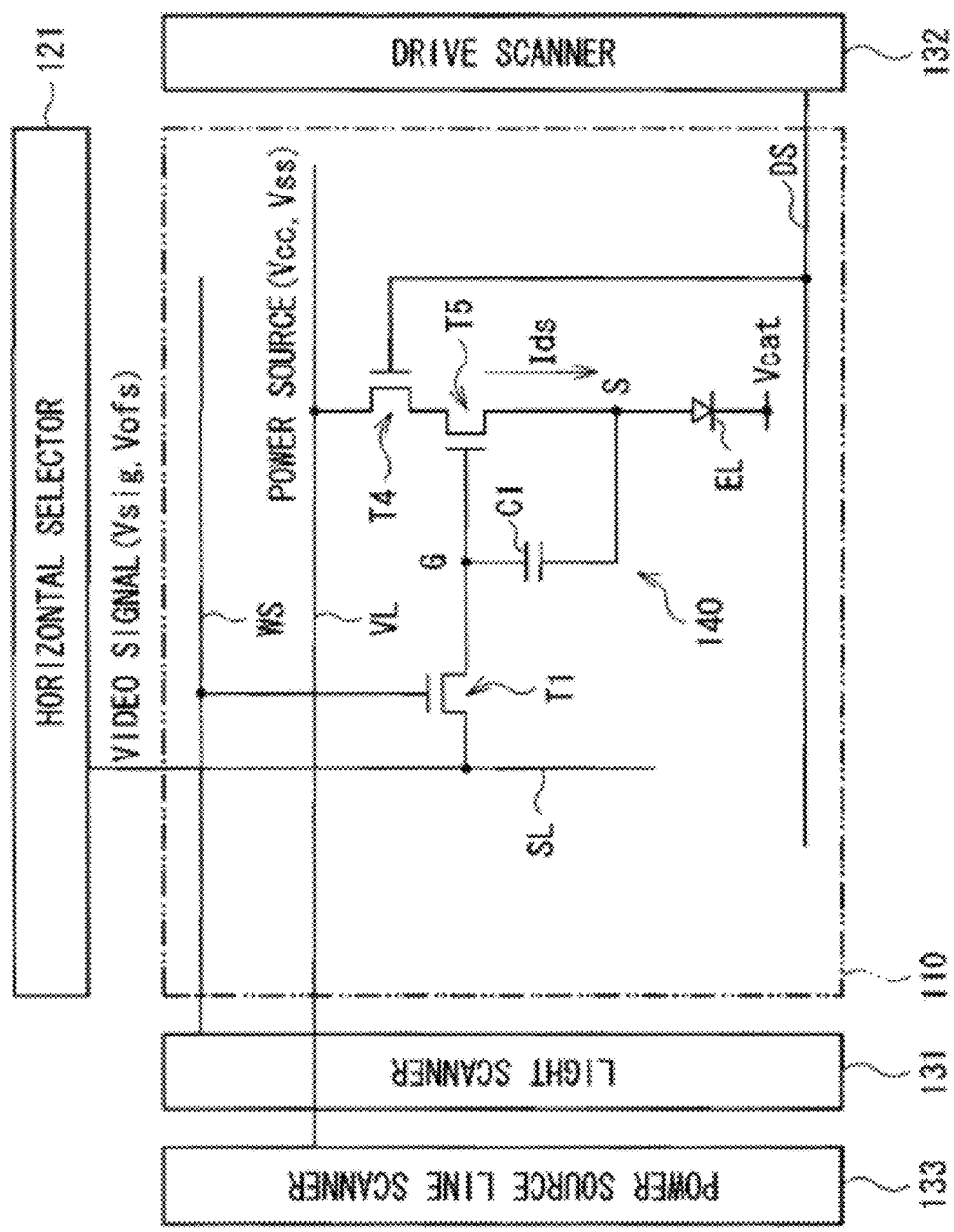
FIG. 2 is an equivalent circuit schematic illustrating an example of a pixel circuit illustrated in FIG. 1.

FIG. 2 illustrates an example of the pixel circuit 140. The pixel circuit 140 is an active drive circuit having a sampling transistor T1, a drive transistor T5, a pixel capacity C1 between the sampling transistor T1 and the drive transistor T5, the organic light emitting device EL connected between the drive transistor T5 and a cathode potential (Vcat), and a switching transistor T4 connected between the drive transistor T5 and the power source line VL.

The sampling transistor T1 makes conduction in response to a control signal supplied from the scanning line WS, and performs sampling of a signal potential Vsig of the video signal Sig supplied from the signal line SL into the pixel capacity C1. The pixel capacity C1 applies an input voltage Vgs between a gate G of the drive transistor T5 and a source S in response to the sampled signal potential Vsig of the video signal Sig. The drive transistor T5 supplies an output current Ids in response to the input voltage Vgs to the organic light emitting device EL (10R, 10G, and 10B). In accordance with the output current Ids, the organic light emitting device EL emits light with luminance in response to the signal potential Vsig of the video signal Sig. The switching transistor T4 makes conduction in response to a control signal supplied from the scanning line DS. The switching transistor T4 connects the drive transistor T5 to the power source line VL while light is emitted. While light is not emitted, the switching transistor T4 does not make conduction, and separates the drive transistor T5 from the power source line VL.

The output current Ids supplied to the organic light emitting device EL has dependability on a threshold voltage Vth of the drive transistor T5. To cancel the dependability of the output current Ids on the threshold voltage Vth, the light scanner 131 and the drive scanner 132 perform correction operation to correct the pixel capacity C1 and sampling operation to write the signal potential Vsig of the video signal Sig into the corrected pixel capacity C1. The horizontal selector 121 supplies a fixed potential Vofs to the signal line SL during the correction operation. After that, the horizontal selector 121 switches to the signal potential Vsig correspondingly to the sampling operation. During the correction operation, the power source line scanner 133 switches from a normal power source potential Vcc supplied during light emission to a potential Vss necessary for the correction operation.

Figure 3:
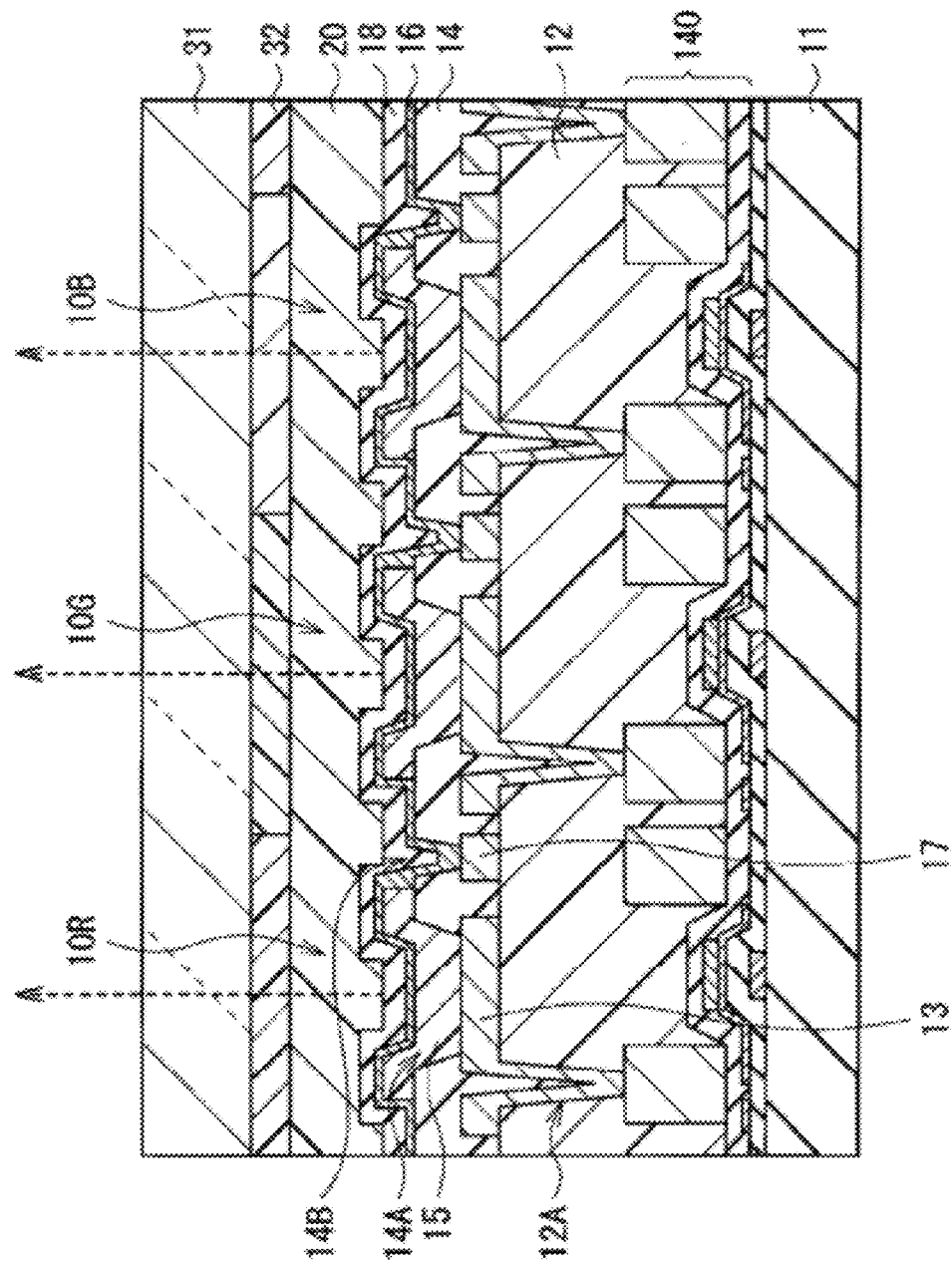
FIG. 3 is a cross sectional view illustrating a configuration of a display region illustrated in FIG. 1.

FIG. 3 illustrates a cross sectional configuration of the display region 110. In the display region 110, the organic light emitting device 10R generating red light, the organic light emitting device 10G generating green light, and the organic light emitting device 10B generating blue light are sequentially formed in a matrix state as a whole. The organic light emitting devices 10R, 10G, and 10B have a reed-like planar shape, and a combination of the organic light emitting devices 10R, 10G, and 10B adjacent to each other composes one pixel.

The organic light emitting devices 10R, 10G, and 10B respectively have a structure in which the foregoing pixel circuit 140, a planarizing layer 12, a first electrode 13 as an anode, an insulating film 14, an organic layer 15 including a light emitting layer 15C described later, and a second electrode 16 as a cathode are layered in this order from the substrate 11 side. In the substrate 11, an auxiliary wiring 17 electrically insulated from the first electrode 13 is formed. The auxiliary wiring 17 is electrically connected to the second electrode 16.

The organic light emitting devices 10R, 10G, and 10B as above are coated with a protective film 18 composed of silicon nitride (SiN), silicon oxide (SiO) or the like according to needs. Further, a sealing substrate 31 made of glass or the like is bonded to the whole area of the protective film 18 with an adhesive layer 20 made of a thermosetting resin, an ultraviolet cure resin or the like in between, and thereby the organic light emitting devices 10R, 10G, and 10B are sealed. The sealing substrate 31 may be provided with a color filter 32 and a light shielding film (not illustrated) as a black matrix according to needs.

The pixel circuit 140 and wirings and the like are electrically connected to the first electrode 13 through a connection hole 12A provided in the planarizing layer 12.

The planarizing layer 12 is intended to planarize a front face of the substrate 11 over which the pixel driving circuit 140 is formed. Since the fine connection hole 12A is formed in the planarizing layer 12, the planarizing layer 12 is preferably made of a material having favorable pattern precision. Examples of component materials of the planarizing layer 12 include an organic material such as polyimide and an inorganic material such as silicon oxide ($SiO_2$).

The first electrode 13 is formed correspondingly to the respective organic light emitting devices 10R, 10G, and 10B. Further, the first electrode 13 has a function as a reflecting electrode to reflect light generated in the light emitting layer, and desirably has high reflectance as much as possible in order to improve light emitting efficiency. The first electrode 13 has a thickness of, for example, from 100 nm to 1000 nm both inclusive, and specifically about 200 nm, and is composed of aluminum (Al) or an alloy containing aluminum (Al), or silver (Ag) or an alloy containing silver (Ag). Further, the first electrode 13 may be composed of a simple substance or an alloy of other metal elements such as chromium (Cr), titanium (Ti), iron (Fe), cobalt (Co), nickel (Ni), molybdenum (Mo), copper (Cu), tantalum (Ta), tungsten (W), platinum (Pt), and gold (Au).

The insulating film 14 is intended to secure insulation between the first electrode 13 and the second electrode 16, and to accurately obtain a desired shape of the light emitting region. For example, the insulting film 14 is made of an organic material such as a photosensitive acryl, polyimide, and polybenzoxazole. The insulating film 14 has apertures 14A and 14B correspondingly to the light emitting region of the first electrode 13 and the auxiliary wiring 17, respectively.

Figure 4:
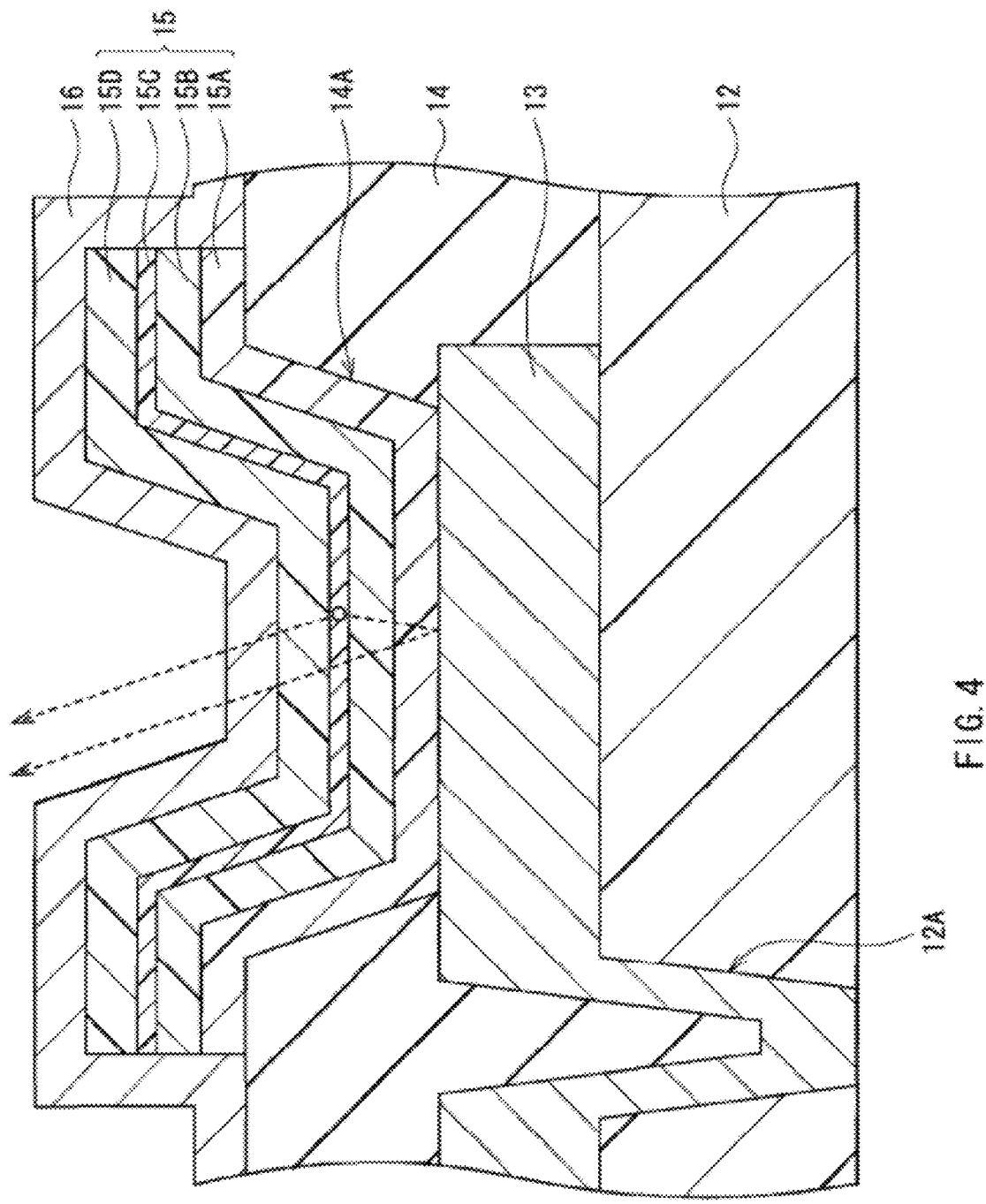
FIG. 4 is a cross sectional view illustrating a structure of an organic layer illustrated in FIG. 3.

FIG. 4 illustrates a cross sectional structure of the organic layer 15. The organic layer 15 is formed at least on the first electrode 13 in the aperture 14A of the insulating film 14. Light is generated only in the aperture 14A, but the organic layer 15 may be also provided continuously on the insulating film 14. The organic layer 15 has, for example, a structure in which an electron hole injection layer 15A, an electron hole transport layer 15B, the light emitting layer 15C, and an electron transport layer 15D are layered from the first electrode 13 side. Of the foregoing layers, the layers other than the light emitting layer 15C may be provided according to needs. Further, the organic layer 15 may have a structure varying according to the light emitting color of the organic light emitting devices 10R, 10G and 10B. The electron hole injection layer 15A is intended to improve the electron hole injection efficiency and functions as a buffer layer to prevent leakage. The electron hole transport layer 15B is intended to improve efficiency to transport holes into the light emitting layer 15C. The light emitting layer 15C is intended to generate light due to electron-hole recombination by applying an electric field. The electron transport layer 15D is intended to improve efficiency to transport electrons into the light emitting layer 15C. It is possible to provide an electron injection layer (not illustrated) composed of LiF, $Li_2O$ or the like between the electron transport layer 15D and the second electrode 16.

The electron hole injection layer 15A of the organic light emitting device 10R has a thickness of, for example, from 1 nm to 300 nm both inclusive, and is composed of azatriphenylene derivative, 4,4',4"-tris(3-methylphenylphenylamino) triphenyl amine (m-MTDATA) or 4,4',4"-tris(2-naphthylphenylamino)triphenyl amine (2-TNATA). The electron hole transport layer 15B of the organic light emitting device 10R has a thickness of, for example, from 5 nm to 300 nm both inclusive, and is composed of bis[(N-naphthyl)-N-phenyl] benzidine (α-NPD). The light emitting layer 15C of the organic light emitting device 10R has a thickness of, for example, from 10 nm to 100 nm thick both inclusive, and is composed of a material in which 40 volume % of 2,6-bis [4-[N-(4-metoxyphenyl)-N-phenyl]aminostyril]naphthalene-1,5-dicarbonitrile (BSN-BCN) is mixed with 8-quinolinol aluminum complex ($Alq_3$). The electron transport layer 15D of the organic light emitting device 10R has a thickness of, for example, from 5 nm to 300 nm both inclusive, and is made of $Alq_3$.

The electron hole injection layer 15A of the organic light emitting device 10G has a thickness of, for example, from 5 nm to 300 nm both inclusive, and is composed of m-MTDATA or 2-TNATA. The electron hole transport layer 15B of the organic light emitting device 10G has a thickness of, for example, from 5 nm to 300 nm both inclusive, and is composed of α-NPD. The light emitting layer 15C of the organic light emitting device 10G has a thickness of, for example, from 10 nm to 100 nm both inclusive, and is composed of a material in which 3 volume % of Coumarin 6 is mixed with $Alq_3$. The electron transport layer 15D of the organic light emitting device 10G has a thickness of, for example, from 5 nm to 300 nm both inclusive, and is made of $Alq_3$.

The electron hole injection layer 15A of the organic light emitting device 10B has a thickness of, for example, from 5 nm to 300 nm both inclusive, and is composed of m-MTDATA or 2-TNATA. The electron hole transport layer 15B of the organic light emitting device 10B has a thickness of, for example, from 5 nm to 300 nm both inclusive, and is composed of α-NPD. The light emitting layer 15C of the organic light emitting device 10B has a thickness of, for example, from 10 nm to 100 nm both inclusive, and is composed of spiro 6Φ. The electron transport layer 15D of the organic light emitting device 10B has a thickness of, for example, from 5 nm to 300 nm both inclusive, and is composed of $Alq_3$.

The second electrode 16 is formed for the organic light emitting devices 10R, 10G, and 10B in common. The second electrode 16 has a thickness of, for example, from 5 nm to 50 nm both inclusive, and is composed of a simple substance or an alloy of metal elements such as aluminum (Al), magnesium (Mg), calcium (Ca), and sodium (Na). Specially, an alloy of magnesium and silver (MgAg alloy) or an alloy of aluminum (Al) and lithium (Li) (AlLi alloy) is preferable. Further, the second electrode 16 may be composed of ITO (indium tin composite oxide) or IZO (indium zinc composite oxide).

The auxiliary wiring 17 is intended to inhibit voltage drop in the second electrode 16, and is formed in a gap between the respective organic light emitting devices 10R, 10G, and 10B. The auxiliary wiring 17 is made of, for example, the same material as that of the first electrode 13 in the same layer as that of the first electrode 13 on the substrate 11. In the case where the auxiliary wiring 17 is made of the same material as that of the first electrode 13, the auxiliary wiring 17 and the first electrode 13 are able to be formed in the same step in the after-mentioned manufacturing process. The material and the structure of the auxiliary wiring 17 are not necessarily the same as those of the first electrode 13.

Figure 5:
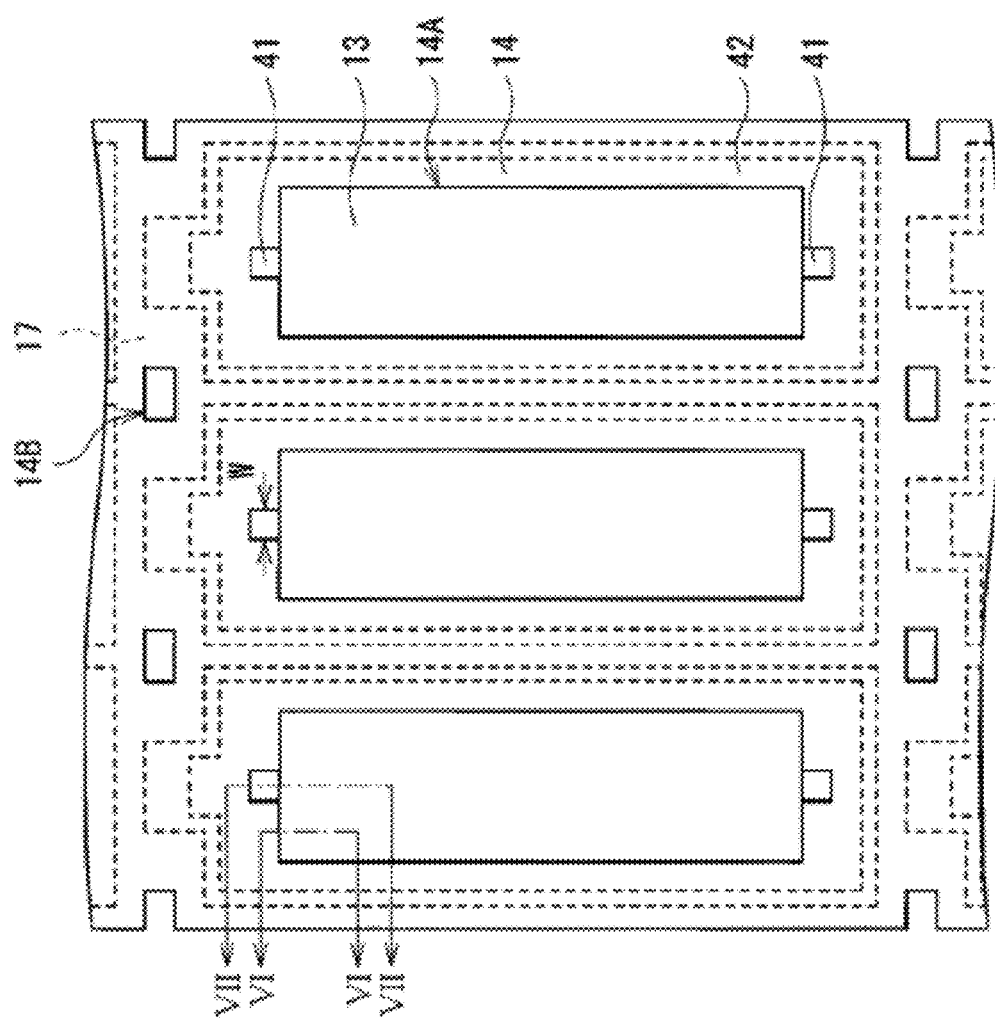
FIG. 5 is a plan view illustrating an example of a positional relationship of a first electrode, an auxiliary wiring, and an insulating film illustrated in FIG. 3.
Figure 6A:
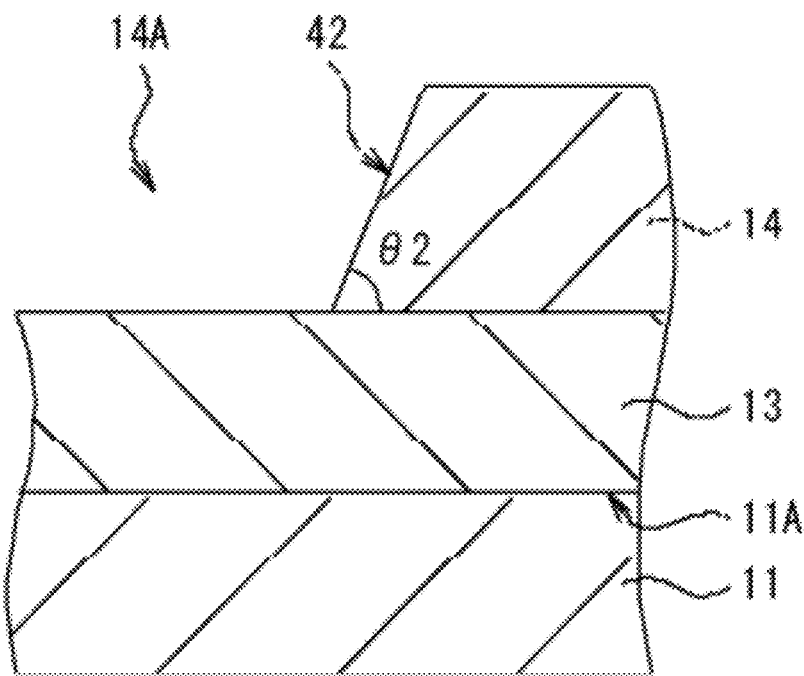
FIGS. 6A and 6B are a cross sectional view taken along line VI-VI of FIG. 5 and a photograph thereof.
Figure 6B:
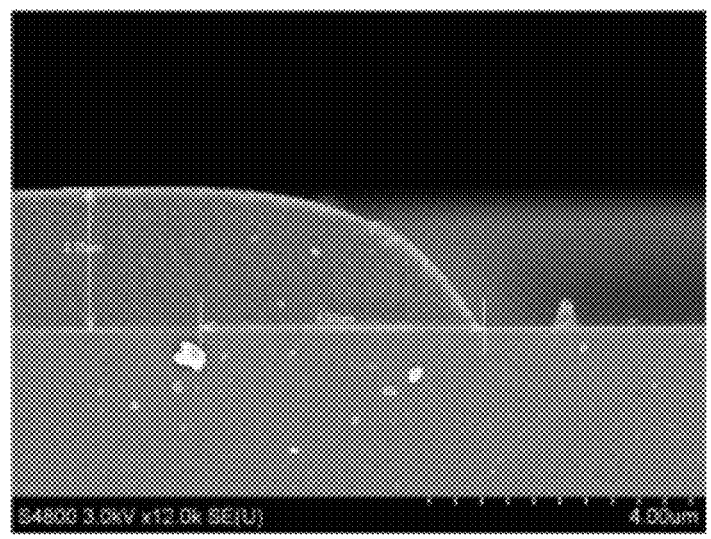
Figure 7A:
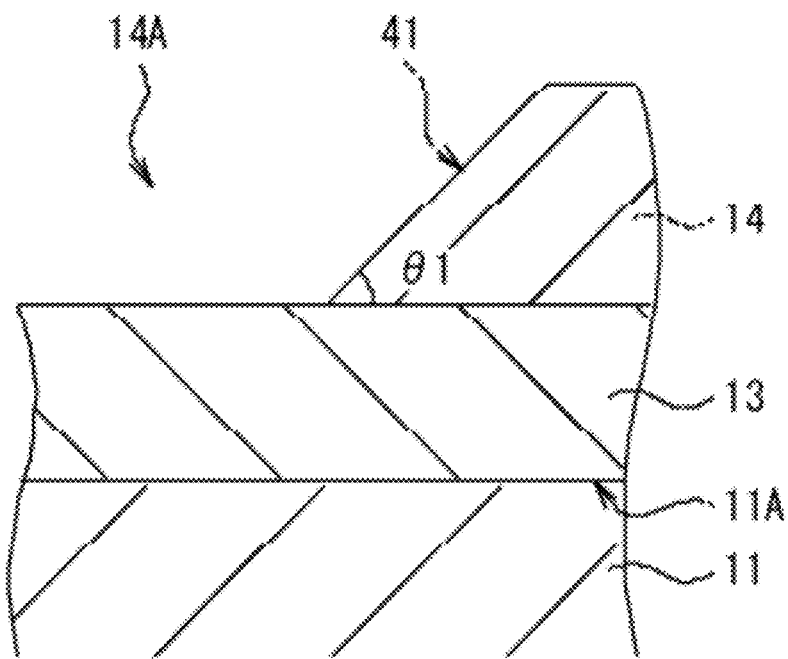
FIGS. 7A and 7B are a cross sectional view taken along line VII-VII of FIG. 5 and a photograph thereof.
Figure 7B:
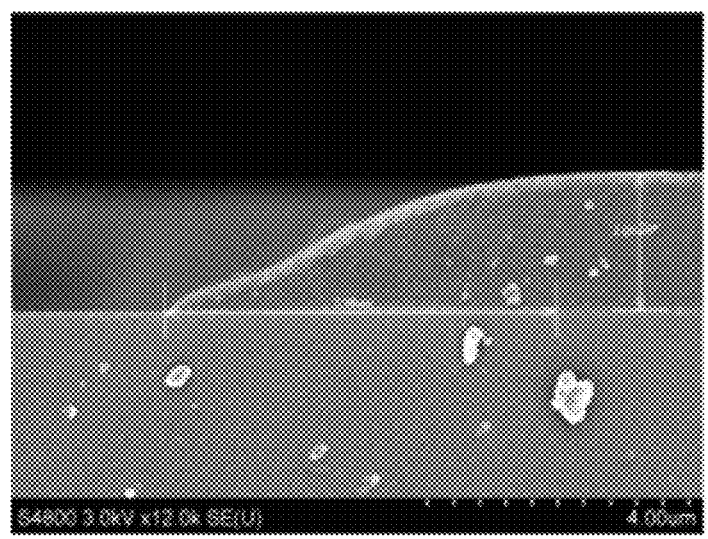

FIG. 5 illustrates an example of a planar positional relationship of the first electrode 13, the auxiliary wiring 17, and the insulating film 14. FIGS. 6A and 6B are a cross section taken along line VI-VI of FIG. 5 and a photograph thereof. FIGS. 7A and 7B are a cross section taken along line VII-VII of FIG. 5 and a photograph thereof. The apertures 14A and 14B of the insulating film 14 are rectangular. The insulating film 14 is provided with a low taper section 41 in part of the circumference of the aperture 14A. The low taper section 41 has a tilt angle θ1 formed by a side face of the aperture 14A and a flat face 11A of the substrate 11 that is smaller than a tilt angle θ2 of the other section of the circumference of the aperture 14A, that is, a high taper section 42. Thereby, in the display unit, breaking of the second electrode 16 is able to be prevented, and a leakage current through the organic layer 15 is able to be decreased.

Figure 8:
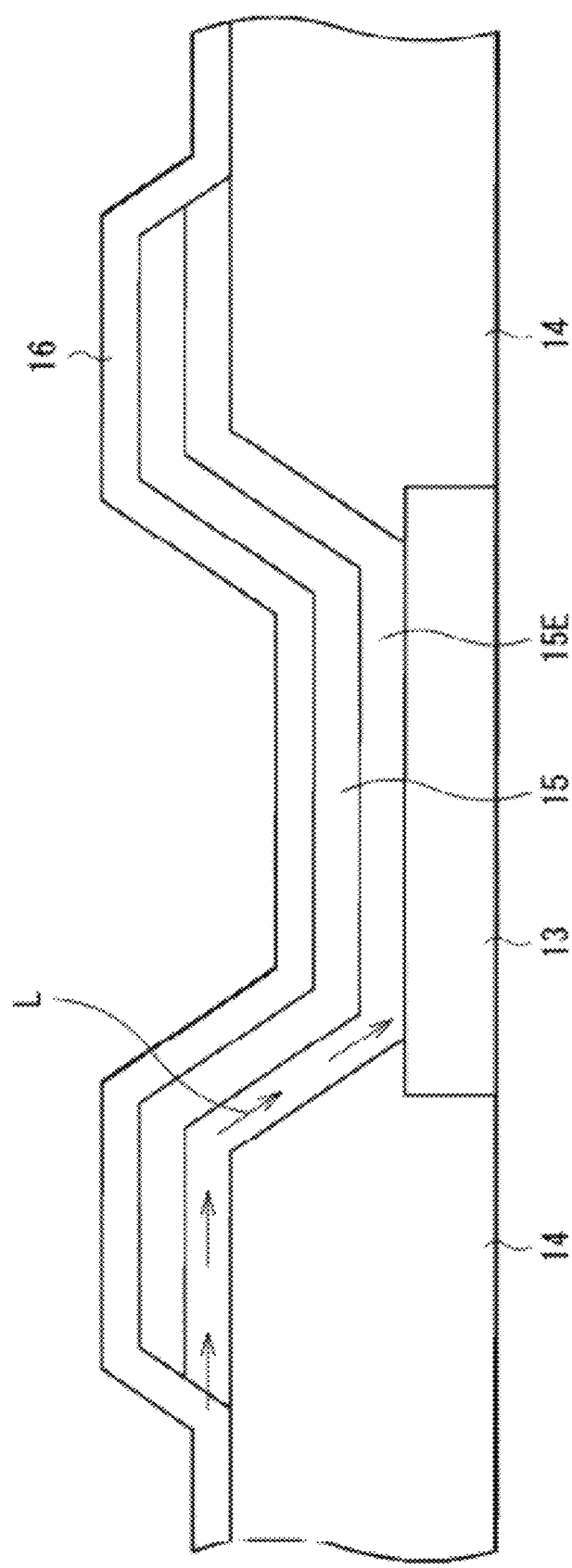
FIG. 8 is a cross sectional view for explaining a path through which a leakage current is flown.

FIG. 8 schematically illustrates a path through which the leakage current is flown. In the organic layer 15, the layer contacted with the first electrode 13 has a large electrical conductivity. Thus, as indicated by arrows, a leakage current L is flown between the first electrode 13 and the second electrode 16 through such a highly-conductive layer 15E. It is often the case that the highly-conductive layer 15E corresponds to the electron hole injection layer 15A or the electron hole transport layer 15B illustrated in FIG. 4, though depending on the laminated structure of the organic layer 15. Further, though not illustrated, in the case where the first electrode 13 is a cathode and the second electrode 16 is an anode, the highly-conductive layer 15E corresponds to the electron injection layer or the electron transport layer in some cases.

Figure 9:
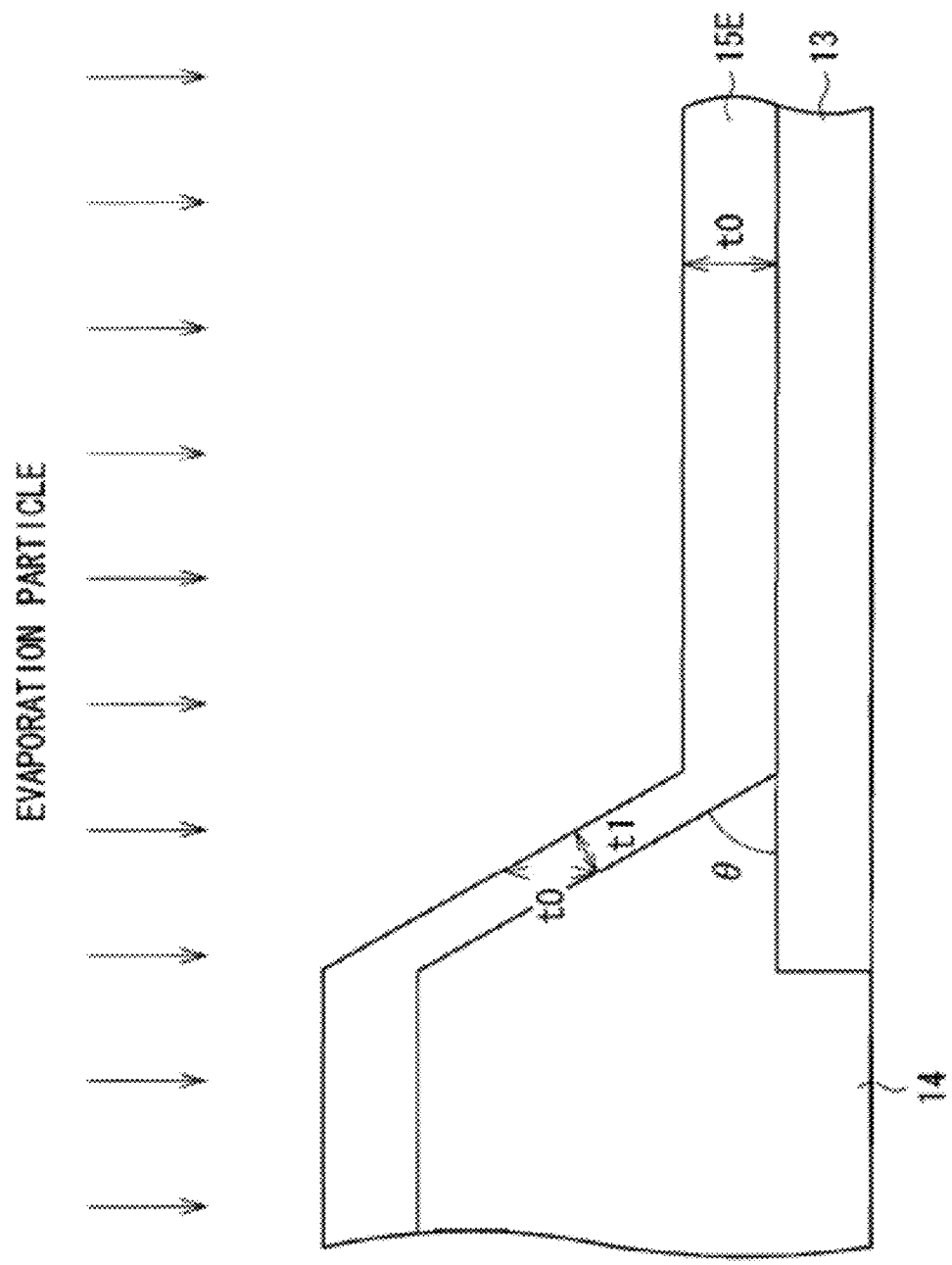
FIG. 9 is a cross sectional view for explaining change of a magnitude of leakage current according to a tilt angle of an aperture of the insulating film.

Next, a description will be hereinafter given of a fact that the magnitude of a leakage current varies according to the tilt angle of the aperture 14A of the insulating film 14 based on FIG. 9. The organic layer 15 is deposited by evaporation method or the like. In the evaporation method, a large portion of material particles to be deposited is a flight composition from the vertical direction to the substrate 11. Therefore, a thickness t1 of the highly-conductive layer 15E in the side face of the aperture 14A is expressed by $t1 \approx t0 \times \cos\theta$, where a thickness of the highly-conductive layer 15E in the flat portion in the aperture 14A is t0 and a tilt angle is $\theta$. That is, in the side face of the aperture 14A, the thickness of the highly-conductive layer 15E becomes thin, and the resistance is increased by just that much. In this case, depending on the tilt angle $\theta$ and the thickness, the thickness of the highly-conductive layer 15E becomes excessively thin, a continuous film is not formed, and as a result the highly-conductive layer 15E is insulated (so-called "disconnection caused by step" is generated). As described above, it is possible to control electrical conductivity of the highly-conductive layer 15E by the tilt angle $\theta$.

In the case where the tilt angle $\theta$ of the aperture 14A is increased, it is possible that the highly-conductive layer 15E causing the leakage current becomes in a state of "disconnection caused by step" to prevent the leakage current. Meanwhile, there is a possibility that the second electrode 16 is also in a state of "disconnection caused by step." Thus, most of the circumference of the aperture 14A is formed as the high taper section 42 having a large tilt angle $\theta$, and the low taper section 41 having a small tilt angle $\theta$ is partially provided. Thereby, the leakage current is decreased, and non-conduction of the second electrode 16 may be inhibited. The smaller a width w of the low taper section 41 is, the smaller the leakage current is. For example, the width w is desirably about from 3 μm to 5 μm both inclusive.

Figure 10:
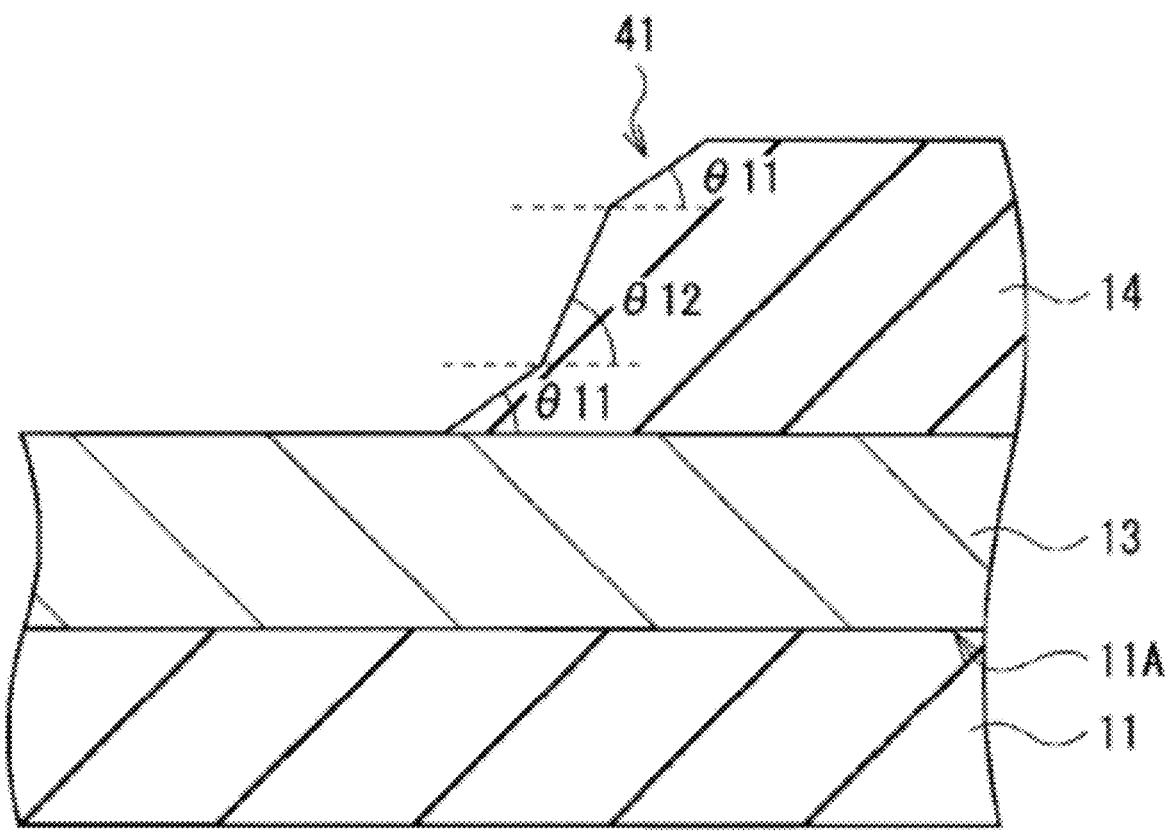
FIG. 10 is a cross sectional view for explaining definition of the tilt angle.

The "tilt angle" herein refers to the maximum angle out of tilt angles in each point located in a region from the end of the side face of the aperture 14A to the portion having the largest thickness. For example, as illustrated in FIG. 10, in the case where in the low taper section 41, only part of the low taper section 41 has a large tilt angle $\theta12$ though most thereof has a small tilt angle $\theta11$, the portion having the large tilt angle $\theta12$ may become in a state of "disconnection caused by step."

The tilt angle $\theta2$ in the high taper section 42 may be, for example, 60 deg or more, and the tilt angle $\theta1$ in the low taper section 41 may be, for example, 30 deg or less. However, the tilt angles are not limited thereto.

Meanwhile, the aperture 14B for the auxiliary wiring 17 may be provided with the low taper section 41 in part of the circumference as the aperture 14A. However, the aperture 14B is preferably provided with the low taper section 41 in the entire circumference, since thereby the contact resistance between the second electrode 16 and the auxiliary wiring 17 is favorably secured.

The low taper section 41 is preferably provided in a side in which a no-organic-layer region 51 provided with no organic layer 15 exists between the aperture 14A and an adjacent aperture 14A out of the four sides of the aperture 14A. A description will be hereinafter given of the reason thereof with reference to FIG. 11 to FIG. 13.

Figure 11:
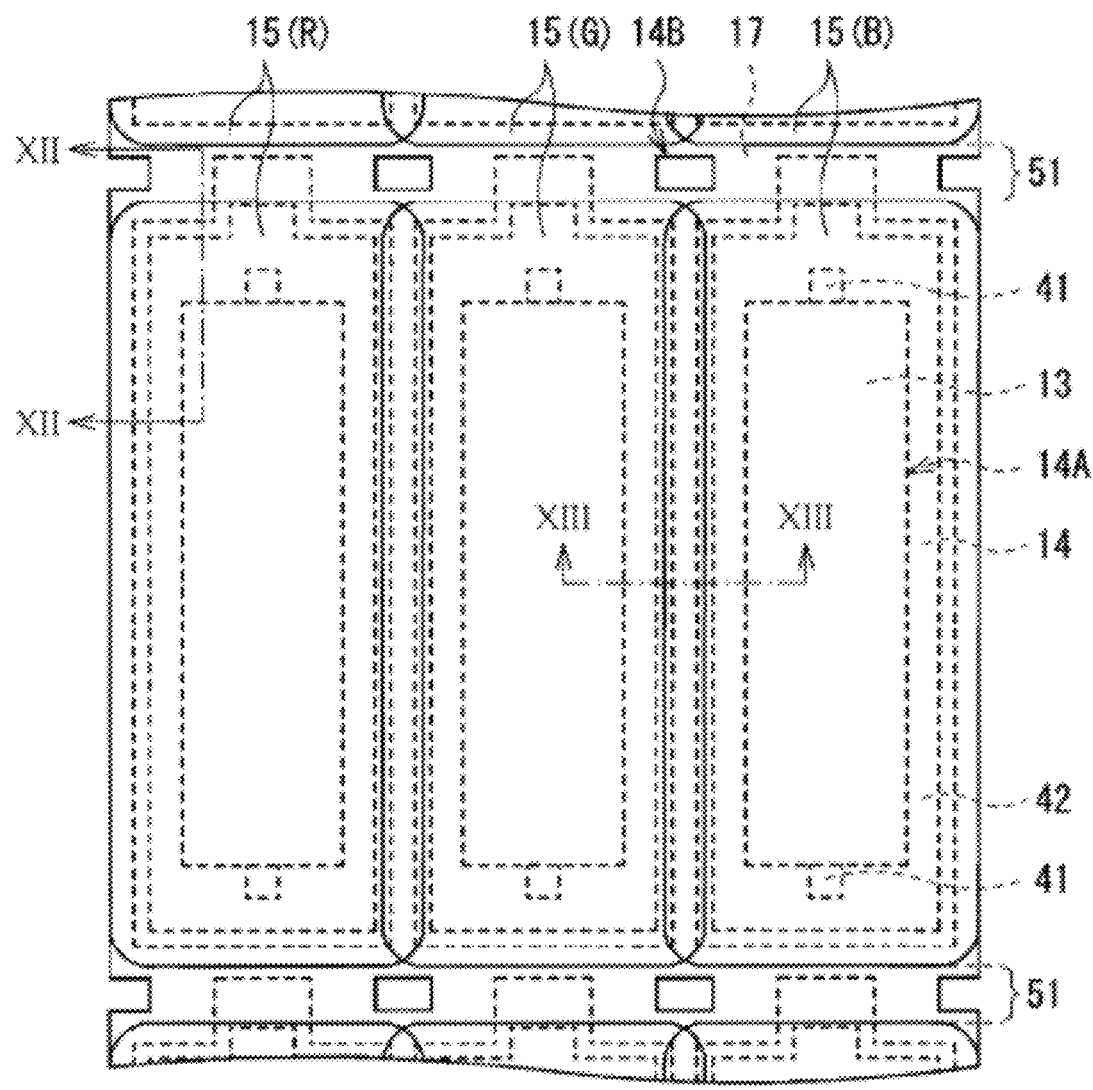
FIG. 11 is a plan view illustrating an example of a positional relationship of the insulating film and the organic layer illustrated in FIG. 3.

FIG. 11 illustrates an example of a planar positional relationship of the insulating film 14 and the organic layer 15. To extend light emission life of the organic light emitting devices 10R, 10G, and 10B, the aperture ratio of the aperture 14A of the insulating film 14 to the first electrode 13 should be as large as possible. Thus, the organic layers 15 of the respective colors R, G, and B are formed to be partially overlapped with each other in a long side of the aperture 14A. Further, the organic layer 15 is formed to avoid the aperture 14B to become a connection hole between the auxiliary wiring 17 and the second electrode 16. Thus, the organic layers 15 are not overlapped with each other in a short side of the aperture 14A, and the no-organic-layer region 51 exists between the aperture 14A and an adjacent aperture 14A.

Figure 12:
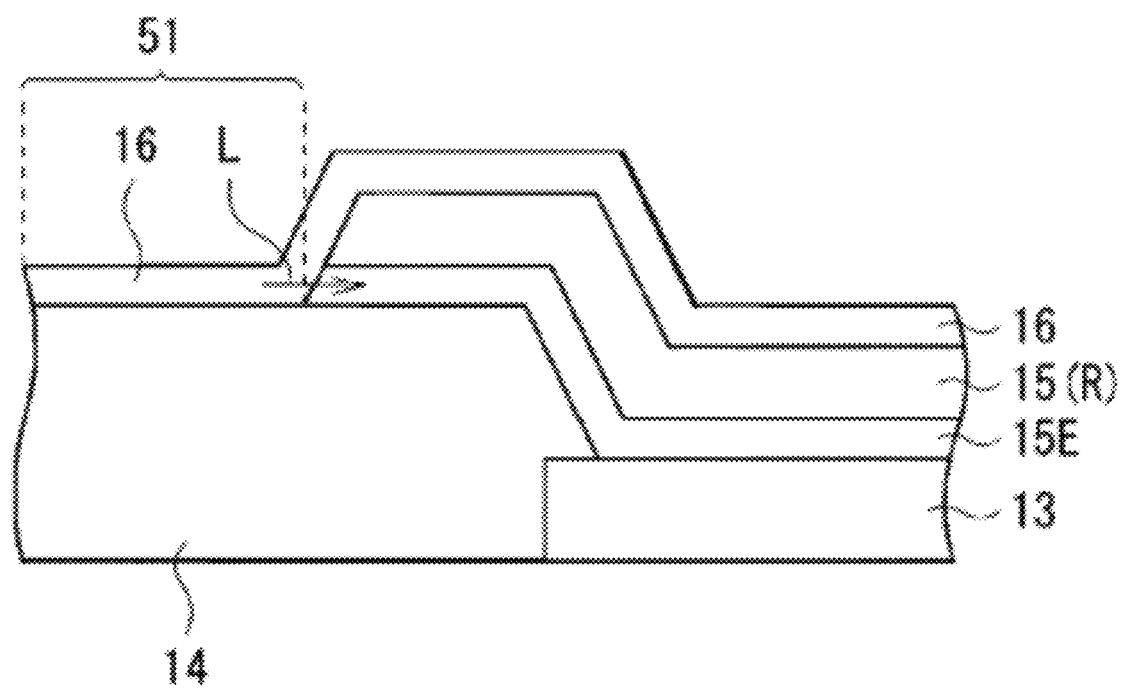
FIG. 12 is a cross sectional view taken along line XII-XII of FIG. 11.
Figure 13:
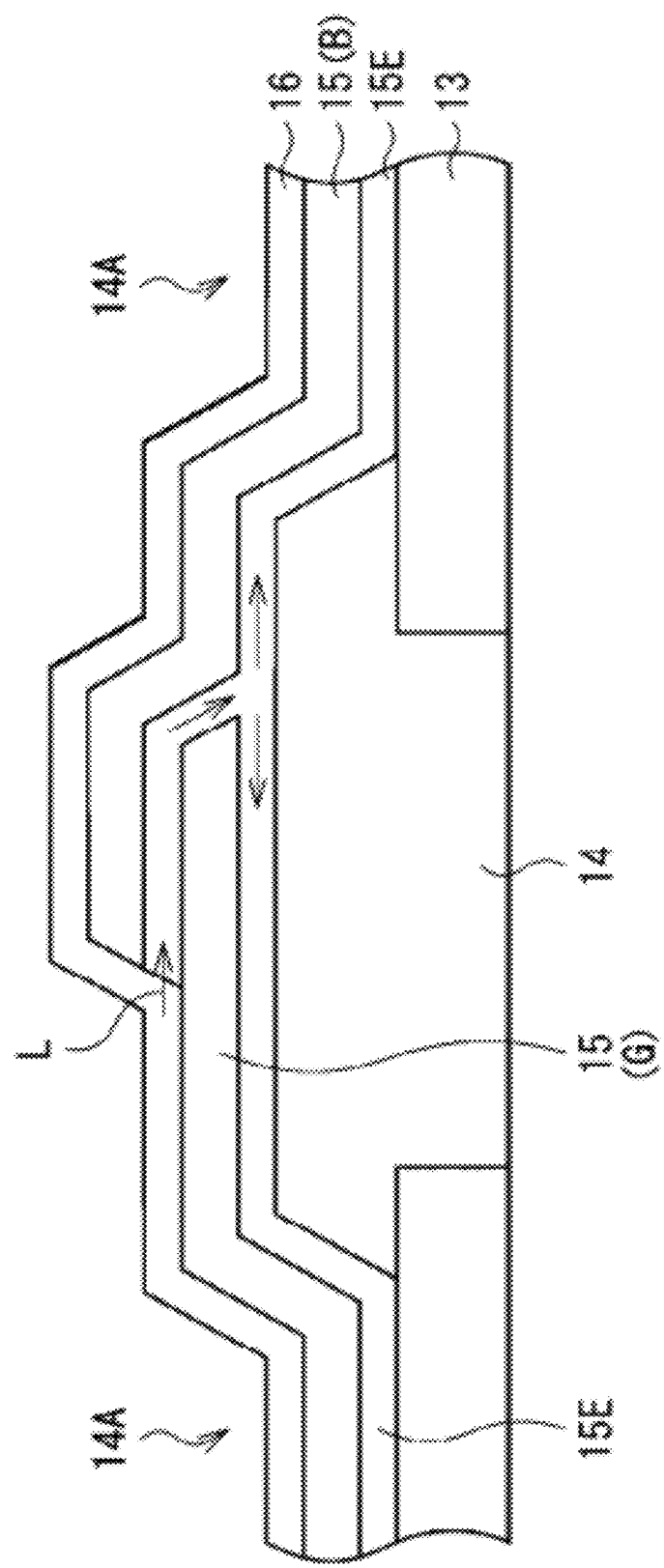
FIG. 13 is a cross sectional view taken along line XIII-XIII of FIG. 11.
Figure 14:
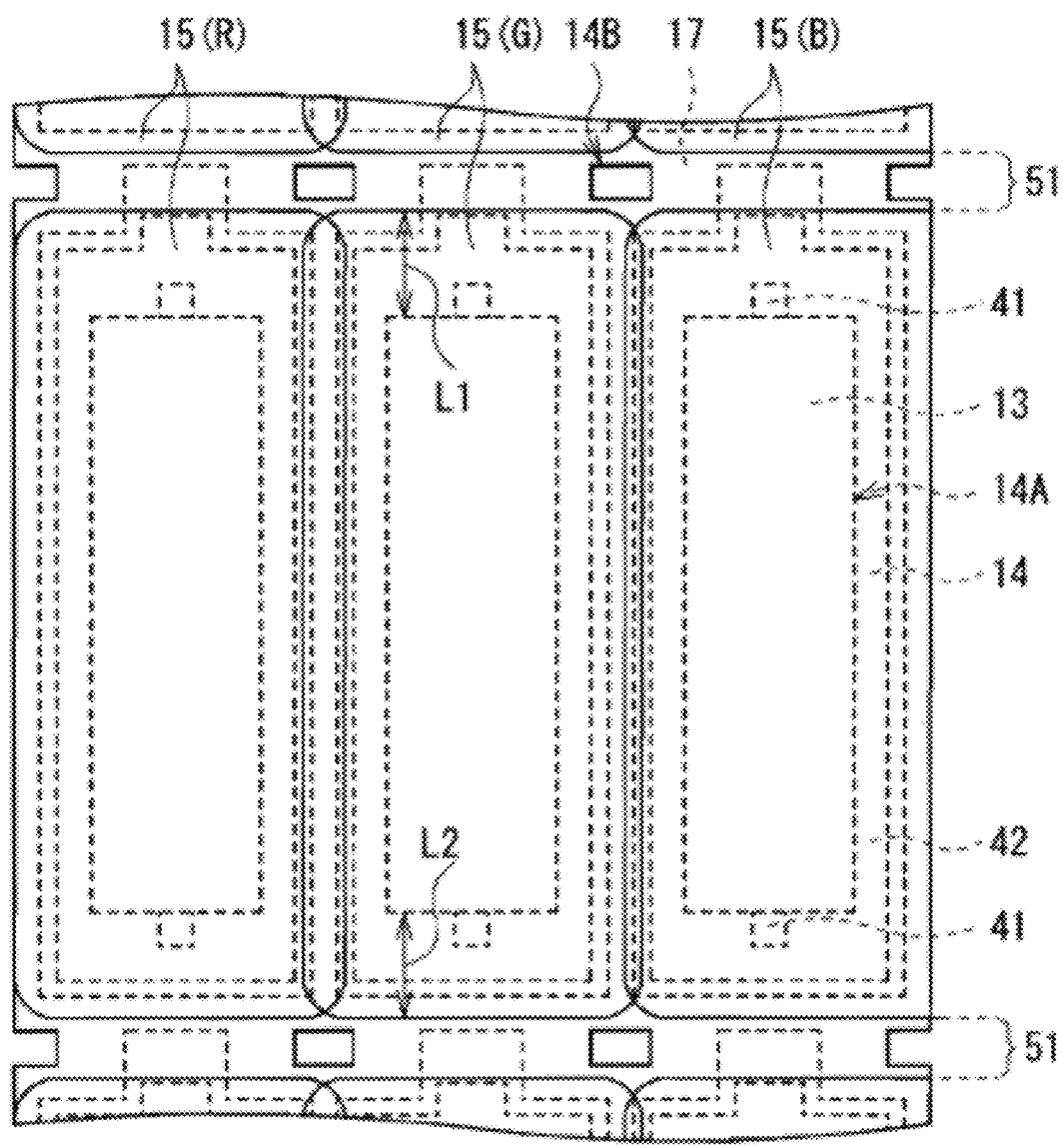
FIG. 14 is a plan view illustrating a case where the deposition position of the organic layer of FIG. 11 is shifted.

FIG. 12 illustrates a cross sectional structure taken along line XII-XII of FIG. 11, and FIG. 13 illustrates a cross sectional structure taken along line XIII-XIII of FIG. 11. There are two paths of a leakage current. One thereof is the case illustrated in FIG. 12 (side in which the organic layers 15 are not overlapped with each other) and the other thereof is the case illustrated in FIG. 13 (side in which the organic layers 15 are overlapped with each other). The size of the leakage current is increased and decreased in proportion to the length of the path, that is, the distance in the highly conducive layer 15E. Therefore, in the case where the deposition positions of the organic layers 15 vary in a transverse direction (horizontal direction) as illustrated in FIG. 14, the leakage current is largely changed according to the deposition position precision in the side in which the organic layers 15 are overlapped with each other. In this case, there is a possibility that the leakage current becomes uneven in the display region 110, resulting in luminance non-uniformity. Therefore, in the case where the low taper section 41 is provided in the side in which the organic layers 15 are not overlapped with each other, that is, in the side in which the no-organic-layer region 51 exists between the aperture 14A and an adjacent aperture 14A, change of the leakage current due to the deposition position precision is able to be decreased.

Further, the low taper section 41 is preferably formed in two opposed sides of the aperture 14A for the following reason. In some cases, the deposition position of the organic layer 15 is shifted not only in the transverse direction (horizontal direction) as illustrated in FIG. 14, but also in a longitudinal direction (vertical direction). If the low taper section 41 is provided only in one of the two opposed sides, when the deposition position is shifted in the longitudinal direction, the leakage current is largely changed, the leakage current becomes uneven in the display region 110, resulting in luminance non-uniformity. Meanwhile, in the case where the low taper section 41 is provided in the two opposed sides, even if the deposition position is shifted in the longitudinal direction, the total length (L1+L2) of the path of the leakage current is able to be constantly uniform in units of one pixel. Therefore, it is possible to uniformize the leakage current in the display region 110, and to inhibit the luminance non-uniformity.

The display unit may be manufactured, for example, as follows.

First, the pixel circuit 140 is formed on the substrate 11 made of the foregoing material. After that, the planarizing layer 12 and the connection hole 12A are formed and fired by coating the whole area of the substrate 11 with a photosensitive resin and providing exposure and development.

Next, a metal film for forming the first electrode 13 and the auxiliary wiring 17 is formed by, for example, sputtering method, and then patterning is provided by photolithography and etching. Thereby, the first electrode 13 and the auxiliary electrode 17 are formed.

Subsequently, the whole area of the substrate 11 is coated with a positive type photosensitive resin made of the foregoing material. With the use of a projection type exposure device and a photo mask, portions to become the aperture 14A and the aperture 14B of the insulating film 14 are irradiated with near-ultraviolet and exposed. At this time, part of an aperture end of the aperture 14A is irradiated with the near-ultraviolet with a smaller light exposure than the aperture 14A (hereinafter referred to as half exposure). Thereby, the tilt angle θ1 in the half-exposed portion becomes smaller than the tilt angle θ2 in the other portion, and the low taper section 41 is formed. The portion having the large tilt angle θ2 becomes the high taper section 42.

After that, image development is performed by using developer such as TMAH (tetramethylammonium hydroxide), the resultant is fired in, for example, $N_2$ at 230 deg C. for 30 minutes. Accordingly, the insulating film 14 is formed.

After that, the organic layer 15 made of the foregoing material is formed by, for example, evaporation method. At this time, the organic layer 15 is formed to avoid the auxiliary wiring 17 by using shadow masks for the respective colors.

After the organic layer 15 is formed, the electron injection layer and the second electrode 16 are deposited by, for example, evaporation method, and the second electrode 16 and the auxiliary wiring 17 are electrically connected. The electron injection layer and the second electrode 16 are formed for the organic light emitting devices 10R, 10G, and 10B in common. Accordingly, the organic light emitting devices 10R, 10G, and 10B are formed.

After the second electrode 16 is formed, the organic light emitting devices 10R, 10G, and 10B are covered with the protective film 18 made of the foregoing material. The adhesive layer 20 is formed on the protective film 18. Subsequently, the sealing substrate 31 that is provided with the color filter 32 and is made of the foregoing material is prepared. The substrate 11 over which the organic light emitting devices 10R, 10G, and 10B are formed and the sealing substrate 31 are bonded with the adhesive layer 20 in between. Accordingly, the display unit illustrated in FIG. 1 to FIG. 4 is completed.

In the display unit, the sampling transistor T1 makes conduction in response to a control signal supplied from the scanning line WS, and performs sampling of the signal potential Vsig of the video signal Sig supplied from the signal line SL into the pixel capacity C1. The input voltage Vgs is applied between the gate G of the drive transistor T5 and the source S in response to the picture potential Vsig. The output current Ids corresponding to the input voltage Vgs is supplied to the organic light emitting device EL (10R, 10G, and 10B). In accordance with the output current Ids, the organic light emitting device EL emits light with luminance corresponding to the signal potential Vsig of the video signal Sig. The light passes through the second electrode 16, the color filter 32, and the sealing substrate 31 and is extracted.

Figure 15:
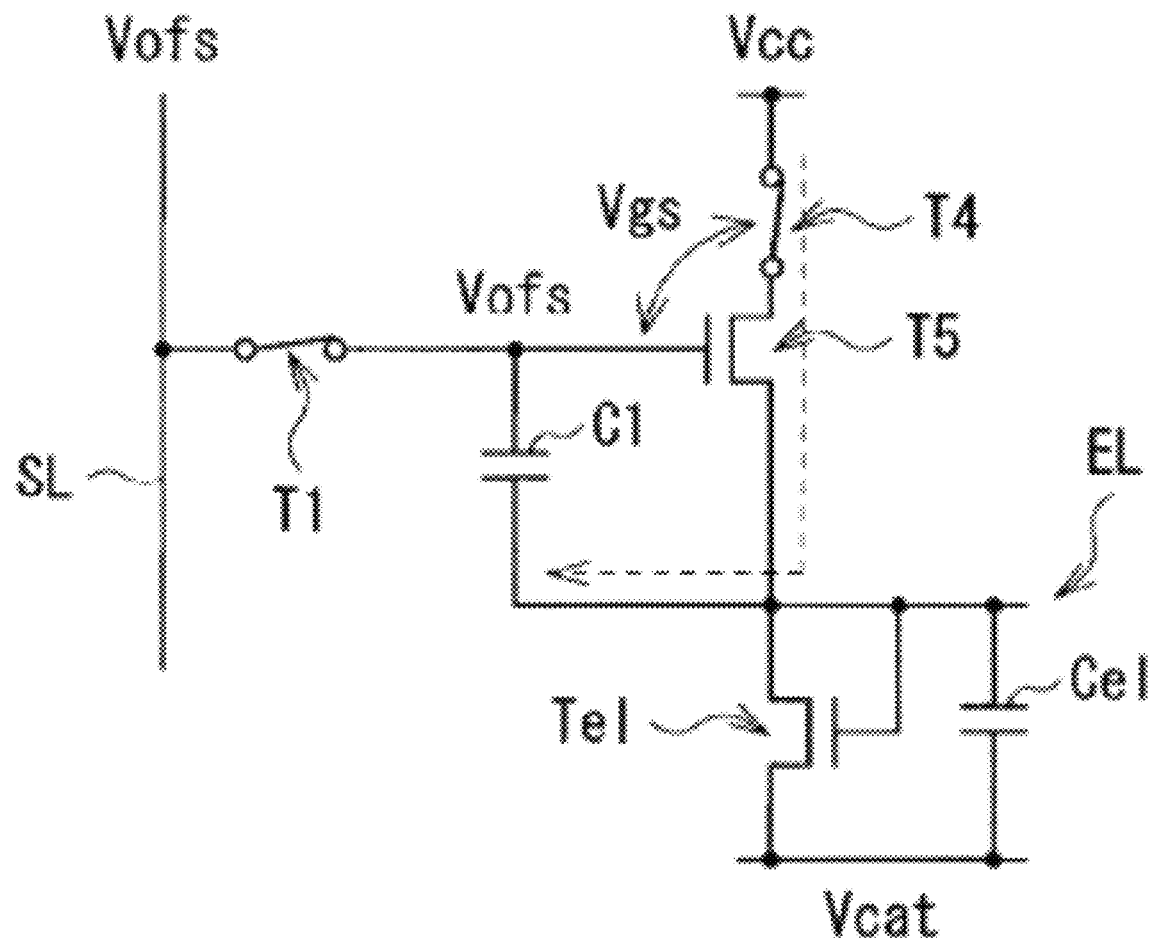
FIG. 15 is a circuit diagram illustrating threshold voltage correction operation using an organic light emitting device as a capacity.

To cancel the dependability of the output current Ids on the threshold voltage Vth, before sampling of the signal potential Vsig into the pixel capacity C1, correction operation to write the voltage corresponding to the threshold voltage Vth of the drive transistor T5 into the pixel capacity C1 is performed. As illustrated in FIG. 15, the equivalent circuit of the organic light emitting device EL is expressed by a diode Tel and a capacity Cel. In the case where a leakage current of the organic light emitting device EL is considerably smaller than a current flowing through the drive transistor T5, the current of the drive transistor T5 is used for charging the pixel capacity C1 and the capacity Cel of the organic light emitting device EL.

In this embodiment, the low taper section 41 is provided in part of the circumference of the aperture 14A of the insulating film 14. The tilt angle θ1 of the low taper section 41 is smaller than the tilt angle θ2 of the high taper section 42 that is the section other than the low taper section 41. Thus, in the high taper section 42, the leakage current through the organic layer 15 is decreased, the foregoing correction operation using the organic light emitting device EL as the capacity Cel is favorably performed, and a failure such as luminance non-uniformity is inhibited. Meanwhile, in the low taper section 41, breaking of the second electrode 16 is prevented, and a failure such as lack of light emission is prevented.

As described above, in this embodiment, the low taper section 41 is provided in part of the circumference of the aperture 14A of the insulating film 14, and the tilt angle θ1 of the low taper section 41 is smaller than the tilt angle θ2 of the high taper section 42 that is the section other than the low taper section 41. Thus, breaking of the second electrode 16 is able to be prevented, and the leakage current through the organic layer 15 is able to be decreased. In particular, this embodiment is suitable for a case using a drive circuit using the organic light emitting device EL as the capacity Cel, and the generation of luminance non-uniformity may be inhibited.

In particular, in the case where the low taper section 41 is provided in a side on which the no-organic-layer region 51 exists between the aperture 14A and an adjacent aperture 14A out of the four sides of the aperture 14A, change of the leakage current due to the deposition position precision is able to be decreased.

Further, in particular, in the case where the low taper section 41 is provided in the two opposed sides of the aperture 14A, even if the deposition position is shifted, the total length (L1+L2) of the path of the leakage current is able to be constantly uniform in units of one pixel. Therefore, the leakage current may be uniformized in the display region 110, and the luminance non-uniformity may be inhibited.

Second Embodiment

Figure 16:
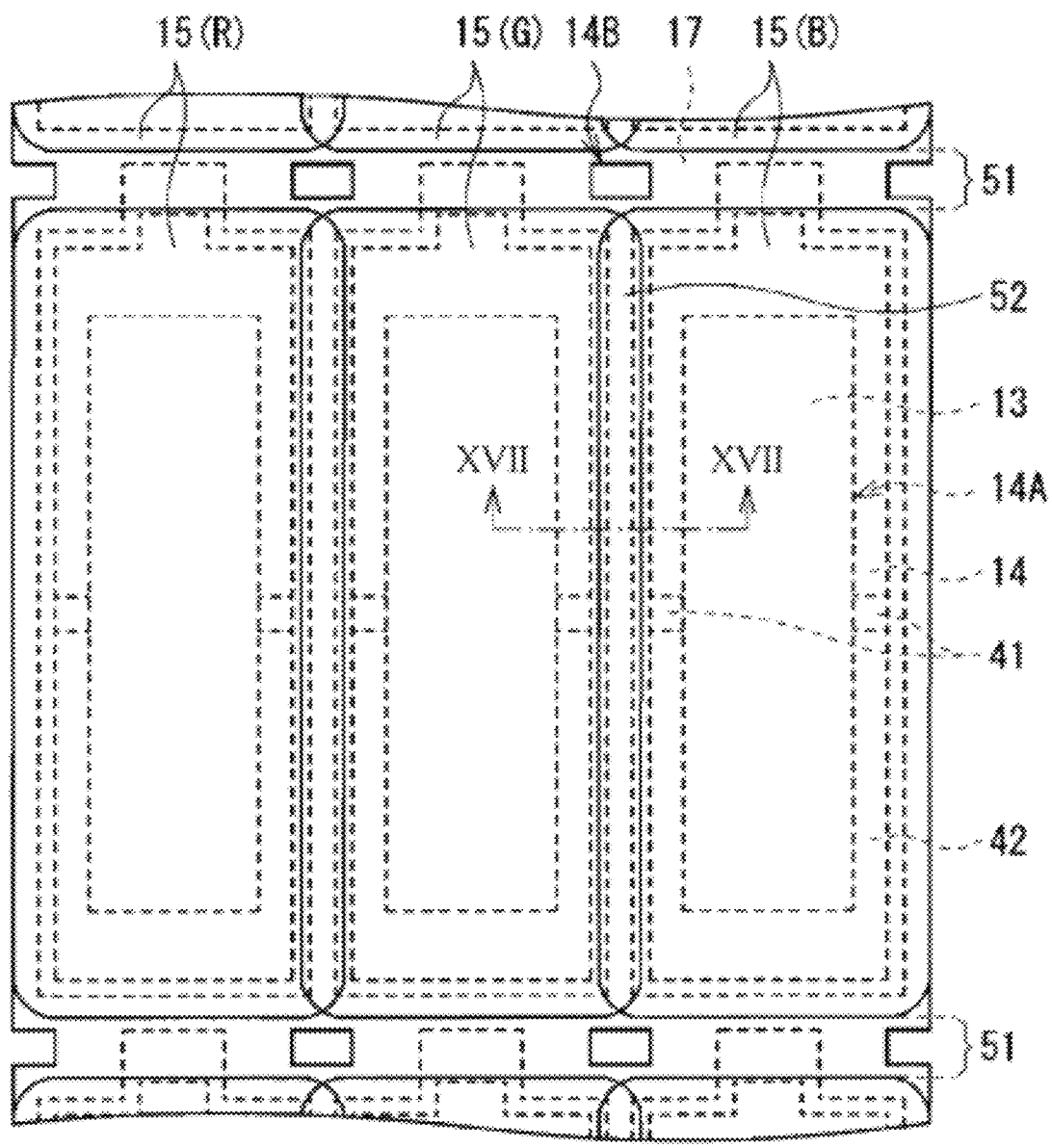
FIG. 16 is a plan view of a display region of a display unit according to a second embodiment of the invention.
Figure 17:
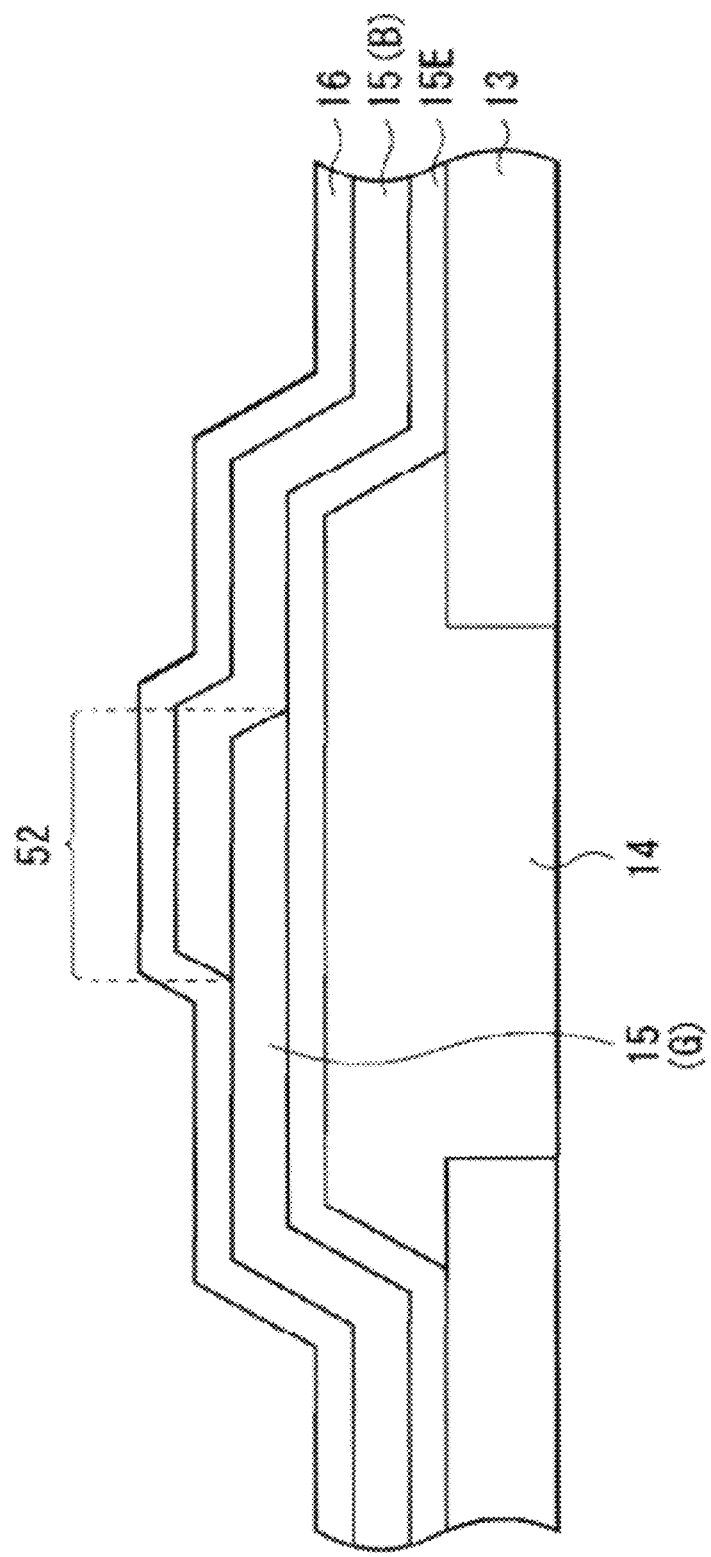
FIG. 17 is a cross sectional view taken along line XVII-XVII of FIG. 16.

FIG. 16 illustrates an example of a planar positional relationship of the insulating film 14 and the organic layer 15 of the display unit according to the second embodiment of the invention. FIG. 17 is a cross sectional structure taken along line XVII-XVII of FIG. 16. The display unit is configuration in the same manner as in the foregoing first embodiment except that the position of the low taper section 41 is different. Therefore, a description will be given by using the identical symbols for the corresponding elements.

This embodiment is suitable for a case in which the organic layer 15 is formed by transfer method. Specifically, the electron hole injection layer 15A, the electron hole transport layer 15B, and the electron transport layer 15D of the organic layer 15 are formed on the whole area by evaporation method, and the light emitting layer 15C is formed for the respective colors by transfer method. Thus, in a long side of the aperture 14A, an organic layer overlap region 52 in which only the light emitting layer 15C of the organic layer 15 is overlapped exists between the aperture 14A and an adjacent aperture 14A. Since only the light emitting layer 15C is overlapped in the organic layer overlap region 52, the highly-conductive layer 15E (the electron hole injection layer 15A or the electron hole transport layer 15B) to become a path of a leakage current is not contacted with the second electrode 16, and thus the leakage current becomes significantly small.

The low taper section 41 is provided in a side in which the organic layer overlap region 52 exists between the aperture 14A and an adjacent aperture 14A out of the four sides of the aperture 14A. Thereby, in the display unit, breaking of the second electrode 16 is prevented, and a leakage current through the organic layer 15 is able to be significantly decreased.

The display unit may be manufactured in the same manner as in the first embodiment except that the position of the low taper section 41 is changed by changing the position of half exposure, and the light emitting layer 15C of the organic layer 15 is formed by transfer method.

In the display unit, as in the first embodiment, the signal potential Vsig of the video signal Sig is provided with sampling into the pixel capacity C1. The input voltage Vgs is applied between the gate G of the drive transistor T5 and the source S in response to the signal potential Vsig. In accordance with the output current Ids corresponding to the input voltage Vgs, the organic light emitting device EL (10R, 10G, and 10B) emits light with luminance in response to the signal potential Vsig of the video signal Sig. Further, in the same manner as in the first embodiment, before sampling of the signal potential Vsig into the pixel capacity C1, correction operation to write the voltage corresponding to the threshold voltage Vth of the drive transistor T5 into the pixel capacity C1 is performed.

In this embodiment, the low taper section 41 is provided in a side in which the organic layer overlap region 52 exists between the aperture 14A and an adjacent aperture 14A out of the four sides of the aperture 14A. Thus, the leakage current through the organic layer 15 becomes significantly decreased not only in the high taper section 42 but also in the low taper section 41, the foregoing correction operation using the organic light emitting device EL as the capacity Cel is performed favorably, and failure such as luminance non-uniformity is inhibited. Further, in the low taper section 41, breaking of the second electrode 16 is prevented, and failure such as no light emission is inhibited.

As described above, in this embodiment, the low taper section 41 is provided in a side in which the organic layer overlap region 52 exists between the aperture 14A and an adjacent aperture 14A out of the four sides of the aperture 14A. Thus, in addition to the effect of the first embodiment, a leakage current in the low taper section 41 is able to be significantly decreased. In particular, the embodiment is suitable for a case that the light emitting layer 15C of the organic layer 15 is formed by transfer method, and the generation of luminance non-uniformity is able to be inhibited.

MODULE AND APPLICATION EXAMPLES

A description will be given of application examples of the display unit described in the foregoing embodiments. The display unit of the foregoing embodiments is applicable to a display unit of an electronic device in any field for displaying a video signal inputted from outside or a video signal generated inside as an image or a picture, such as a television device, a digital camera, a notebook personal computer, a portable terminal device such as a mobile phone, and a video camera.

Module

Figure 18:
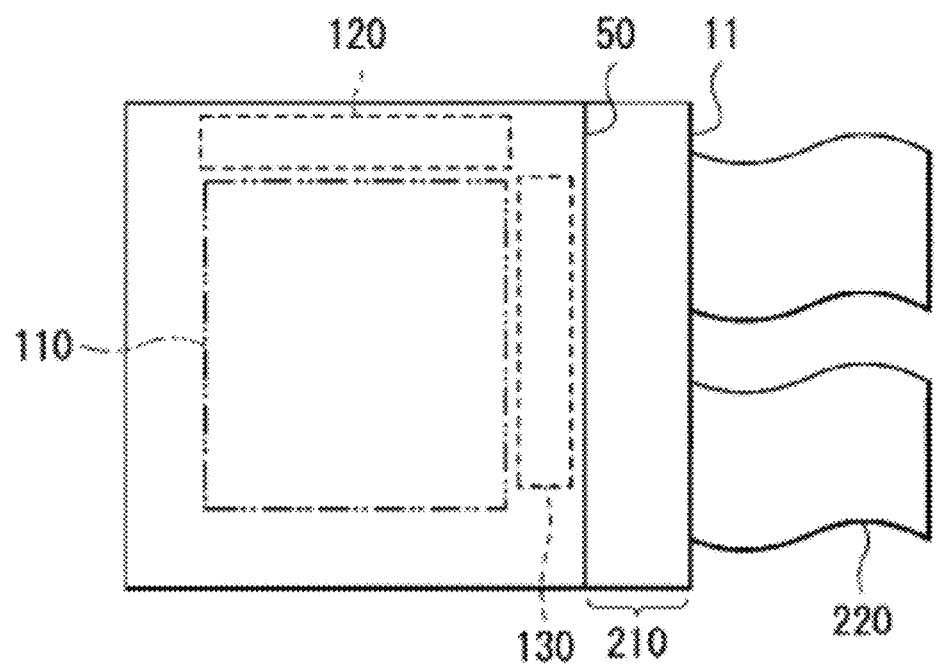
FIG. 18 is a plan view illustrating a schematic configuration of a module including the display unit of the foregoing embodiments.

The display unit of the foregoing embodiments is incorporated in various electronic devices such as after-mentioned first to fifth application examples as a module as illustrated in FIG. 18, for example. In the module, for example, a region 210 exposed from a sealing substrate 50 and an adhesive layer 40 is provided in a side of the substrate 11, and an external connection terminal (not illustrated) is formed in the exposed region 210 by extending wirings of the signal line drive circuit 120 and the scanning line drive circuit 130. The external connection terminal may be provided with a Flexible Printed Circuit (FPC) 220 for inputting and outputting a signal.

First Application Example

Figure 19:
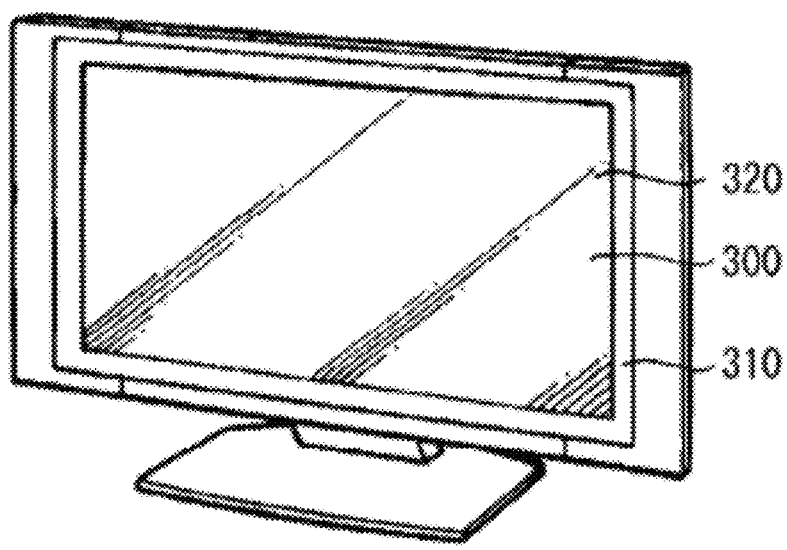
FIG. 19 is a perspective view illustrating an appearance of a first application example of the display unit of the foregoing embodiments.

FIG. 19 is an appearance of a television device to which the display unit of the foregoing embodiments is applied. The television device has, for example, a picture display screen section 300 including a front panel 310 and a filter glass 320. The picture display screen section 300 is composed of the display unit according to the foregoing respective embodiments.

Second Application Example

Figure 20A:
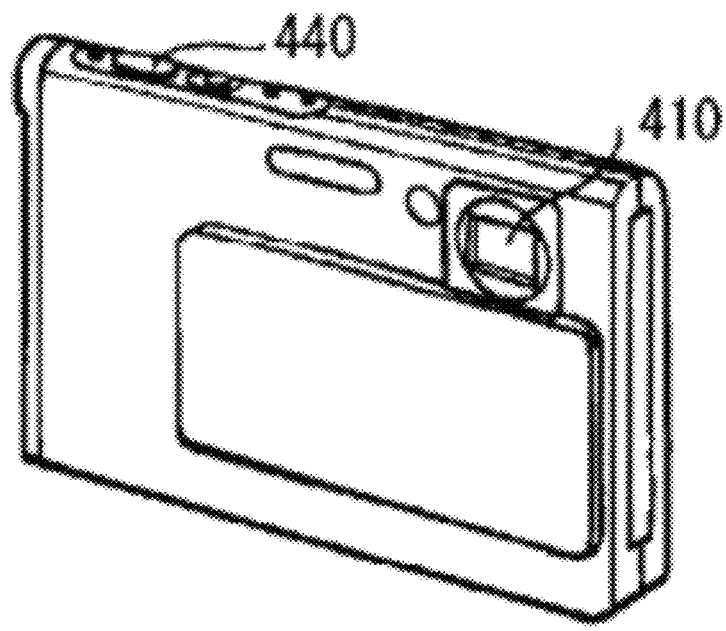
FIG. 20A is a perspective view illustrating an appearance viewed from the front side of a second application example.
Figure 20B:
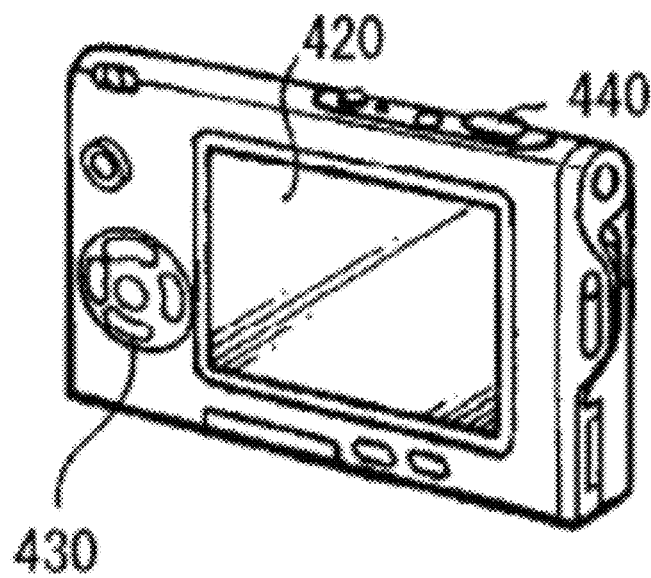
FIG. 20B is a perspective view illustrating an appearance viewed from the rear side of the second application example.

FIGS. 20A and 20B are an appearance of a digital camera to which the display unit of the foregoing embodiments is applied. The digital camera has, for example, a light emitting section for a flash 410, a display section 420, a menu switch 430, and a shutter button 440. The display section 420 is composed of the display unit according to the foregoing respective embodiments.

Third Application Example

Figure 21:
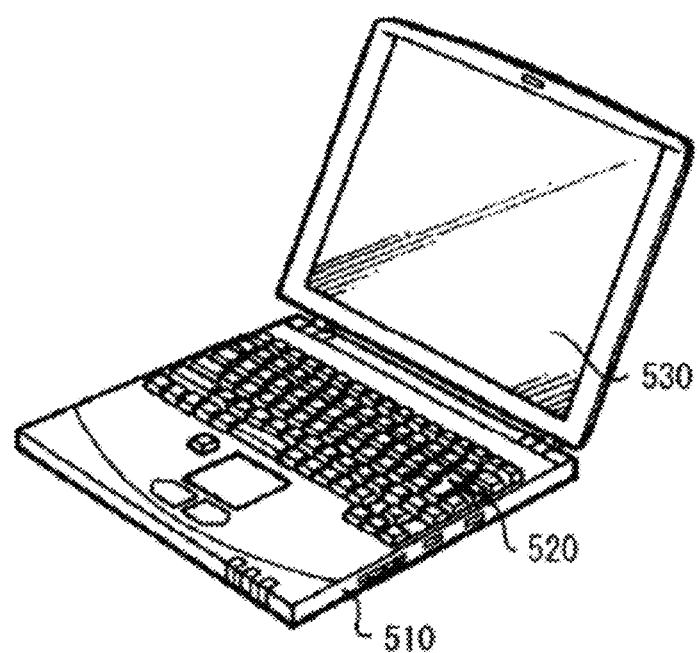
FIG. 21 is a perspective view illustrating an appearance of a third application example.

FIG. 21 is an appearance of a notebook personal computer to which the display unit of the foregoing embodiments is applied. The notebook personal computer has, for example, a main body 510, a keyboard 520 for operation of inputting characters and the like, and a display section 530 for displaying an image. The display section 530 is composed of the display unit according to the foregoing respective embodiments.

Fourth Application Example

Figure 22:
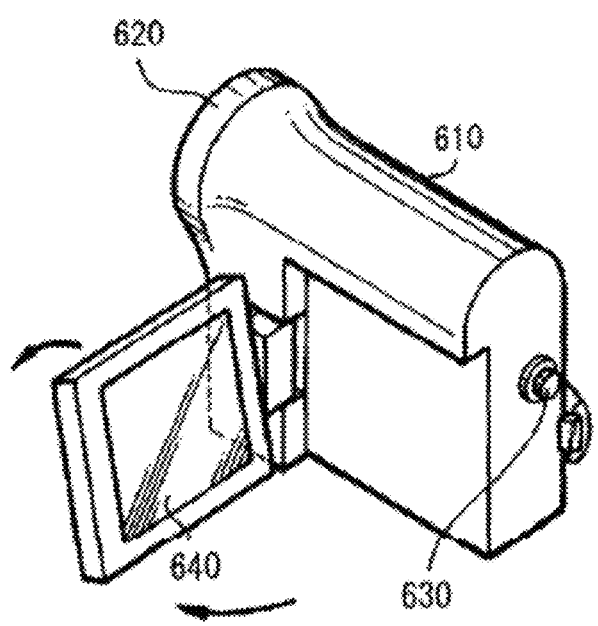
FIG. 22 is a perspective view illustrating an appearance of a fourth application example.
Figure 23:
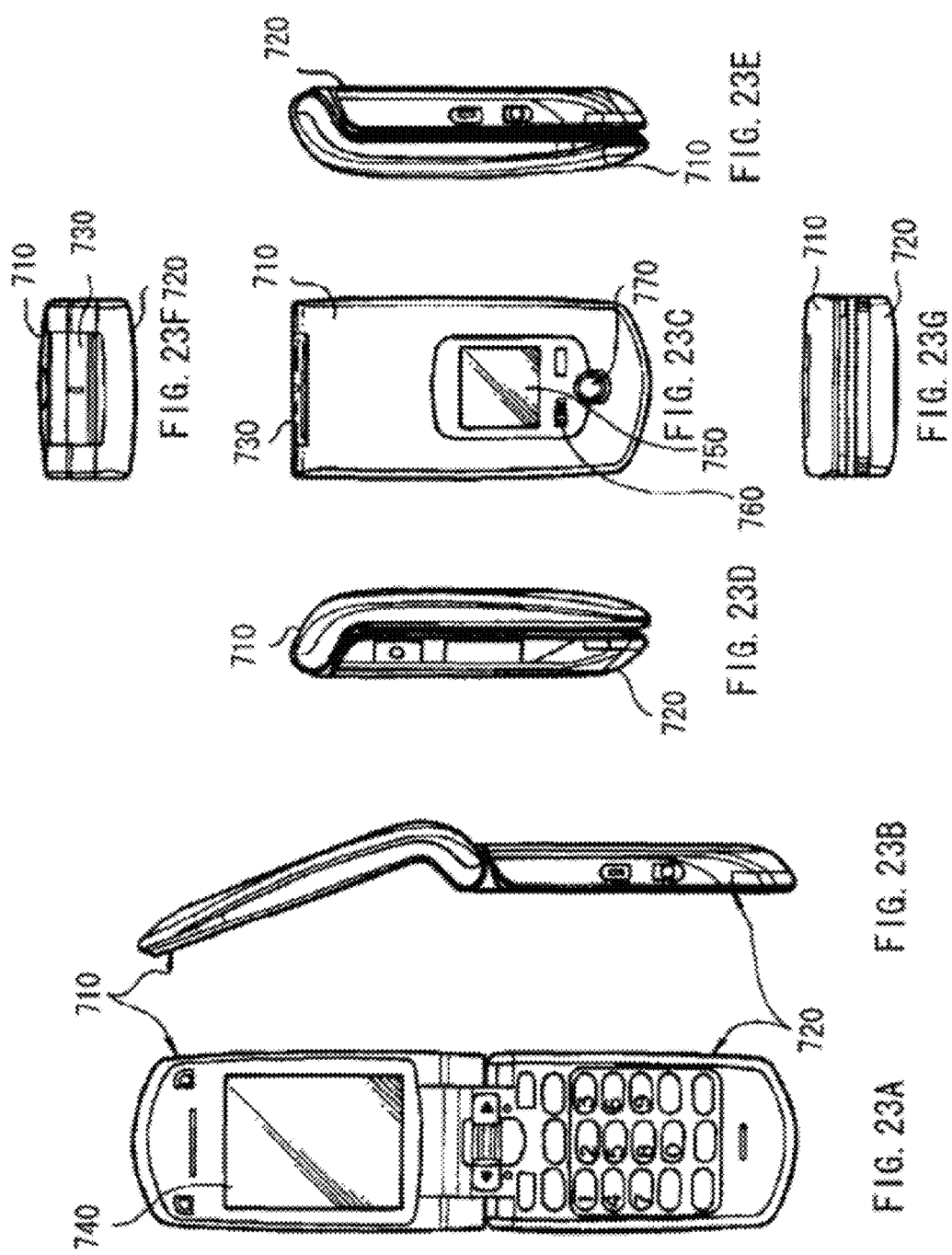
FIG. 23A is an elevation view of a fifth application example unclosed.
FIG. 23B is a side view thereof.
FIG. 23C is an elevation view of the fifth application example closed.
FIG. 23D is a left side view thereof.
FIG. 23E is a right side view thereof.
FIG. 23F is a top view thereof.
FIG. 23G is a bottom view thereof.

FIG. 22 is an appearance of a video camera to which the display unit of the foregoing embodiments is applied. The video camera has, for example, a main body 610, a lens for shooting an object 620 provided on the front side face of the main body 610, a start/stop switch in shooting 630, and a display section 640. The display section 640 is composed of the display unit according to the foregoing respective embodiments.

Fifth Application Example

FIGS. 23A to 23G illustrate an appearance of a mobile phone to which the display unit of the foregoing embodiments is applied. In the mobile phone, for example, an upper package 710 and a lower package 720 are jointed by a joint section (hinge section) 730. The mobile phone has a display 740, a sub-display 750, a picture light 760, and a camera 770. The display 740 or the sub-display 750 is composed of the display unit according to the foregoing respective embodiments.

While the invention has been described with reference to the embodiments, the invention is not limited to the foregoing embodiments, and various modifications may be made. For example, the material, the thickness, the film-forming method, the film-forming conditions and the like of each layer are not limited to those described in the foregoing embodiments, but other material, other thickness, other film-forming method, and other film-forming conditions may be adopted.

Figure 24:
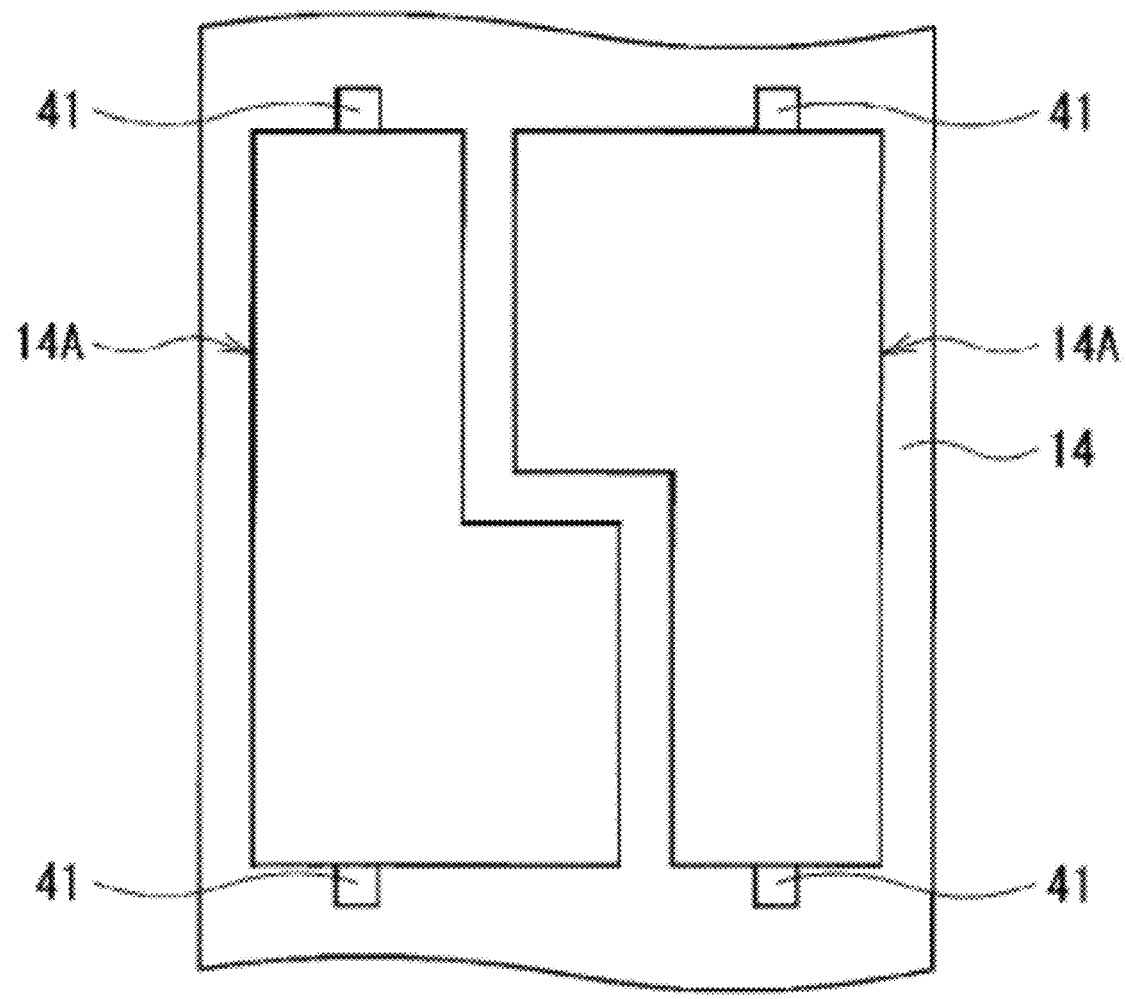
FIG. 24 is a plan view illustrating a modified example of the invention.

In addition, in the foregoing embodiments, the description has been specifically given of the structure of the organic light emitting devices 10R, 10G, and 10B. However, it is not necessary to provide all layers, and other layer may be further provided. For example, in the foregoing embodiment, the description has been specifically given of the case that the aperture 14A is in the shape of a rectangle. However, the shape of the aperture 14A is not limited to the rectangle, but may be any planar shape including a plurality of sides, and may be an irregular shape as illustrated in FIG. 24, for example. In such a case, the low taper section 41 may be provided for two opposed sides.

The present application contains subject matter related to that disclosed in Japanese Priority Patent Application JP 2008-129858 filed in the Japanese Patent Office on May 16, 2008, the entire content of which is hereby incorporated by reference.

It should be understood by those skilled in the art that various modifications, combinations, sub-combinations and alternations may occur depending on design requirements and other factors insofar as they are within the scope of the appended claims or the equivalents thereof.

What is claimed is:

1. A display unit comprising:
a plurality of organic light emitting devices over a flat substrate with a flat face defining a major surface, each of the plurality of organic light emitting devices having (a) a first electrode, (b) an insulating film having an aperture exposing the first electrode, (c) an organic layer at least on the first electrode in the aperture, the organic layer having a plurality of layers including a light emitting layer, and (d) a second electrode on the organic layer in the aperture, wherein,
the aperture in the insulating film has (i) a planar shape having a plurality of sides, (ii) a first taper portion tapered with a first tilt angle, the first tilt angle defined by a first side face portion of the aperture and the flat face of the substrate, and (iii) a second taper portion tapered with a second tilt angle that is smaller and more acute than the first tilt angle, the second tilt angle defined by a second side face portion of the aperture and the flat face of the substrate, the plurality of sides of the aperture including sides having only the first taper portion formed therein and at least one other side having the second taper portion formed therein, the first taper portion provided so as to decrease a leakage current through the organic layer and the second taper portion provided so as to prevent a non-conduction of the second electrode.

2. The display unit according to claim 1, wherein:
the plurality of sides of the aperture include a side on which a no-organic-layer region not formed with the organic layer exists between the aperture and an adjacent aperture, and
the second taper portion is formed in the side on which the no-organic-layer region exists.

3. The display unit according to claim 1, wherein two second taper portions are formed in two opposed sides of the aperture, respectively.

4. The display unit according to claim 1, wherein:
the plurality of sides of the aperture include a side on which an organic layer overlap region exists between the aperture and an adjacent aperture, and
the second taper portion is formed in the side on which the organic layer overlap region exists.

* * * * *